(12) United States Patent
Mori

(10) Patent No.: US 10,361,746 B2
(45) Date of Patent: Jul. 23, 2019

(54) SEMICONDUCTOR DEVICE AND SEMICONDUCTOR SYSTEM

(71) Applicant: RENESAS ELECTRONICS CORPORATION, Tokyo (JP)

(72) Inventor: Hisaya Mori, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/183,287

(22) Filed: Nov. 7, 2018

(65) Prior Publication Data

US 2019/0199391 A1    Jun. 27, 2019

(30) Foreign Application Priority Data

Dec. 22, 2017 (JP) .................. 2017-246357

(51) Int. Cl.
H04B 1/46 (2006.01)
H04B 1/48 (2006.01)

(52) U.S. Cl.
CPC ...................... *H04B 1/48* (2013.01)

(58) Field of Classification Search
CPC .................. H04B 1/48; H04B 1/46
USPC ............................ 455/79, 67.14
See application file for complete search history.

(56) References Cited

U.S. PATENT DOCUMENTS

| | | | | |
|---|---|---|---|---|
| 3,654,486 A * | 4/1972 | Cubert | ................. | H03K 3/2893 326/130 |
| 3,860,762 A * | 1/1975 | Klaiber | ................. | H04M 1/677 379/189 |
| 4,060,764 A * | 11/1977 | Bethards | ................. | H04B 1/44 333/14 |
| 4,731,553 A * | 3/1988 | Van Lehn | ........ | H03K 19/00361 326/27 |
| 6,169,885 B1 * | 1/2001 | Walukas | ................. | H03F 1/305 330/297 |
| 6,201,455 B1 * | 3/2001 | Kusunoki | ................. | H01P 1/15 327/308 |
| 6,229,992 B1 * | 5/2001 | McGeehan | ............ | H04B 1/408 370/278 |

(Continued)

FOREIGN PATENT DOCUMENTS

JP        2008-228038 A    9/2008

*Primary Examiner* — April G Gonzales

(74) *Attorney, Agent, or Firm* — McDermott Will & Emery LLP

(57) ABSTRACT

A semiconductor device includes an RF circuit and a microcontroller. The RF circuit has: a transmission unit generating a transmission signal; a reception unit generating a first generation signal and a second generation signal; and a transmission/reception loop-back switching unit switching between a first coupling state of coupling an output terminal of the transmission unit to a transmission antenna and coupling an input terminal of the reception unit to a reception antenna and a second coupling state of coupling an output terminal of the transmission unit to the input terminal of the reception unit. The microcontroller switches the transmission/reception loop-back switching unit to the second coupling state and executes a test of the RF circuit on the basis of the second generation signal when the transmission/reception loop-back switching unit is in the second coupling state and an output signal of a first sensor circuit.

16 Claims, 20 Drawing Sheets

(56) References Cited

U.S. PATENT DOCUMENTS

| | | | | |
|---|---|---|---|---|
| 6,345,062 B1* | 2/2002 | Taguchi | G11B 7/1263 | 372/38.01 |
| 6,876,851 B2* | 4/2005 | Watanabe | H04W 16/18 | 455/423 |
| 7,154,341 B2* | 12/2006 | Yamamoto | H03L 7/099 | 331/2 |
| 7,756,472 B2* | 7/2010 | Darabi | H03B 21/01 | 323/267 |
| 8,135,355 B2* | 3/2012 | Gorbachov | H04B 1/18 | 455/73 |
| 8,265,569 B2* | 9/2012 | Barlow | H01L 29/0692 | 327/328 |
| 8,369,798 B2* | 2/2013 | Pan | H03F 1/32 | 455/73 |
| 8,417,286 B2* | 4/2013 | Gorbachov | H04B 1/0064 | 455/552.1 |
| 9,020,442 B1* | 4/2015 | Mastio | G01S 13/767 | 455/67.11 |
| 2004/0106380 A1* | 6/2004 | Vassiliou | H04B 17/14 | 455/73 |
| 2004/0242166 A1* | 12/2004 | Ikuma | H04B 1/44 | 455/78 |
| 2006/0223457 A1* | 10/2006 | Rahman | H04B 1/0475 | 455/78 |
| 2007/0296483 A1* | 12/2007 | Grandry | G01R 19/16519 | 327/419 |
| 2008/0113625 A1* | 5/2008 | Maeda | H04B 1/30 | 455/67.14 |
| 2012/0106219 A1* | 5/2012 | Okuda | G06K 7/10237 | 363/127 |
| 2012/0161845 A1* | 6/2012 | Pehlivanoglu | H03D 7/1458 | 327/356 |
| 2012/0220243 A1* | 8/2012 | Mendolia | H04B 1/0458 | 455/77 |
| 2013/0065542 A1* | 3/2013 | Proudkii | H03H 11/1291 | 455/78 |
| 2013/0072125 A1* | 3/2013 | Yoon | H01P 1/10 | 455/67.11 |
| 2014/0085008 A1* | 3/2014 | Cohen | H03F 1/0227 | 330/297 |
| 2014/0106685 A1* | 4/2014 | Pehlivanoglu | H03D 7/1458 | 455/78 |
| 2014/0113573 A1* | 4/2014 | Khatri | H03F 1/0277 | 455/78 |
| 2014/0154997 A1* | 6/2014 | Chen | H04B 3/46 | 455/67.14 |
| 2015/0077163 A1* | 3/2015 | Ghazinour | H03F 3/45085 | 327/118 |
| 2016/0197684 A1* | 7/2016 | Tsai | H04B 17/0085 | 455/67.14 |
| 2016/0204881 A1* | 7/2016 | Chung | H04B 17/00 | 455/67.14 |
| 2017/0346444 A1* | 11/2017 | Cho | H03L 7/087 | |
| 2018/0096777 A1* | 4/2018 | Akcasu | H01F 27/2804 | |

* cited by examiner

FIG. 8

| OBJECT CONDITIONS | | OBJECT CIRCUIT | CONDITION 1 | CONDITION 2 | CONDITION 3 | ... | CONDITION 6 | ... | CONDITION n |
|---|---|---|---|---|---|---|---|---|---|
| CONDITIONS OF FREQUENCY OF OSCILLATION CIRCUIT | CONDITION OF DIFFERENCE FREQUENCY BETWEEN OSCILLATION CIRCUITS 20 AND 22 | OSCILLATION CIRCUIT 20 | 86.0GHz | 86.0GHz | 86.0GHz | ... | 86.0GHz | ... | 86.0GHz |
| | | OSCILLATION CIRCUIT 22 | 85.5GHz | 85.6GHz | 85.7GHz | ... | 86.0GHz | ... | 86.0GHz |
| CONDITIONS OF TRANSMISSION CIRCUIT | POWER AMPLIFIER OUTPUT POWER CONDITION | TRANSMISSION CIRCUIT 23a, 23b TRANSMISSION CIRCUIT 23c FOR TEST | 10dBm | 10dBm | 10dBm | ... | 10dBm | ... | 5dBm |
| | PHASE CONDITION | TRANSMISSION CIRCUIT 23a, 23b TRANSMISSION CIRCUIT 23c FOR TEST | 90° | 90° | 90° | ... | 90° | ... | 0° | ns

SEMICONDUCTOR DEVICE AND SEMICONDUCTOR SYSTEM

CROSS-REFERENCE TO RELATED APPLICATIONS

The disclosure of Japanese Patent Application No. 2017-246357 filed on Dec. 22, 2017 including the specification, drawings and abstract is incorporated herein by reference in its entirety.

BACKGROUND

The present invention relates to a semiconductor device and a semiconductor system and relates to, for example, a semiconductor device and a semiconductor system performing a test of an RF (Radio Frequency) circuit provided for the semiconductor device.

In recent years, in products and the like related to a vehicle, it is requested to enhance function safety. The function safety is to assure a state where there is no unacceptable risk by adding functional devices in the environment where a product is used. By assuring the function safety, for example, even in the case where a failure occurs in any of parts configuring a system, devices for detecting the failure, avoiding risks, and lessening the risks are introduced so that a safe state can be assured.

Japanese Unexamined Patent Application Publication No. 2008-228038 (patent literature 1) discloses a semiconductor integrated circuit including a reception system, a transmission system, and an RF test signal supply circuit. In the patent literature 1, in a test mode, the RF test signal supply circuit converts an RF transmission output signal from the transmission system to an RF test signal in a frequency band which can be processed by the reception system, and supplies the resultant signal to the reception system. In the patent literature 1, in a test, when a reception signal in the reception system is normal, it is determined that the reception system and the transmission system of the semiconductor integrated circuit are normal.

SUMMARY

In the technique disclosed in the patent literature 1, however, abnormality such as a failure or a suspected failure in the transmission and reception systems cannot be automatically detected. Consequently, the technique disclosed in the patent literature 1 has a problem that the function safety cannot be realized.

The other problems and novel features will become apparent from the description of the specification and appended drawings.

According to an embodiment, a semiconductor device has an RF circuit having a transmission/reception switching unit switching between a first coupling state for a normal operation and a second coupling state for a loop-back test; and a microcontroller executing a test of the RF circuit on the basis of a second generation signal when the transmission/reception loop-back switching unit is in a second coupling state and an output signal of a first sensor circuit.

According to the embodiment, the function safety in the semiconductor device can be realized.

BRIEF DESCRIPTION OF THE DRAWINGS

FIG. 8 is a diagram illustrating an example of conditions of a detailed test according to the first embodiment.

DETAILED DESCRIPTION

In the following embodiments, when it is necessary for convenience, an embodiment will be described by being divided into a plurality of sections or embodiments. Unless otherwise clearly specified, they are not non-related to one another but have relations such as modification, application, detailed description, and supplementary explanation in which one is a part or all of the other. In the following embodiments, in the case of referring to the number of elements and the like (including the number of pieces, numerical value, quantity, and range), except for the case where it is clearly mentioned, the case where the invention is principally clearly limited to a specific value, and the like, the invention is not limited to the specific value. The number may be larger or smaller than the specific value.

Further, in the following embodiments, obviously, components (including operation steps) are not always necessary except for the case where it is clearly mentioned, the case where it is considered that a component is principally clearly necessary, and the like.

Outline of Embodiments

Figure 1:
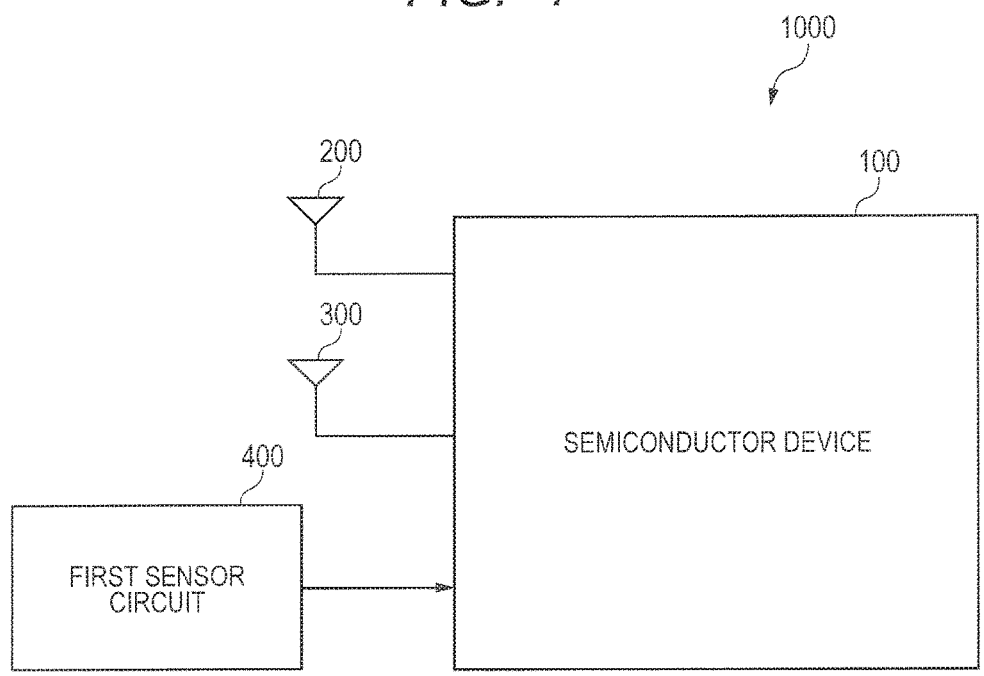
FIG. 1 is a block diagram illustrating a configuration example of a semiconductor system according to an embodiment.

Prior to description of embodiments, outline of embodiments will be described. FIG. 1 is a block diagram illustrating a configuration example of a semiconductor system 1000 according to an embodiment. The semiconductor system 1000 is, for example, a semiconductor system mounted on a vehicle. The semiconductor system 1000 has a semiconductor device 100, a transmission antenna 200, a reception antenna 300, and a first sensor circuit 400. The semiconductor device 100, the transmission antenna 200, and the reception antenna 300 configure, for example, a radar device mounted on a vehicle.

The transmission antenna 200 is an antenna transmitting a transmission signal output from the semiconductor device 100. The transmission signal output from the semiconductor device 100 is, for example, a signal of a millimeter waveband.

The reception antenna 300 is an antenna receiving a reception signal as a reflection wave which is a transmission signal transmitted from the transmission antenna 200 and reflected by a target object. The reception antenna 300 outputs the reception signal to the semiconductor device 100.

The first sensor circuit 400 is a sensor circuit detecting the target object. A target object detected by the first sensor circuit 400 and a target object reflecting the transmission signal transmitted from the transmission antenna 200 are the same object. The first sensor circuit 400 includes, for example, a camera module, a laser module, and the like. The first sensor circuit 400 outputs a detection result of the object to the semiconductor device 100.

Figure 2:
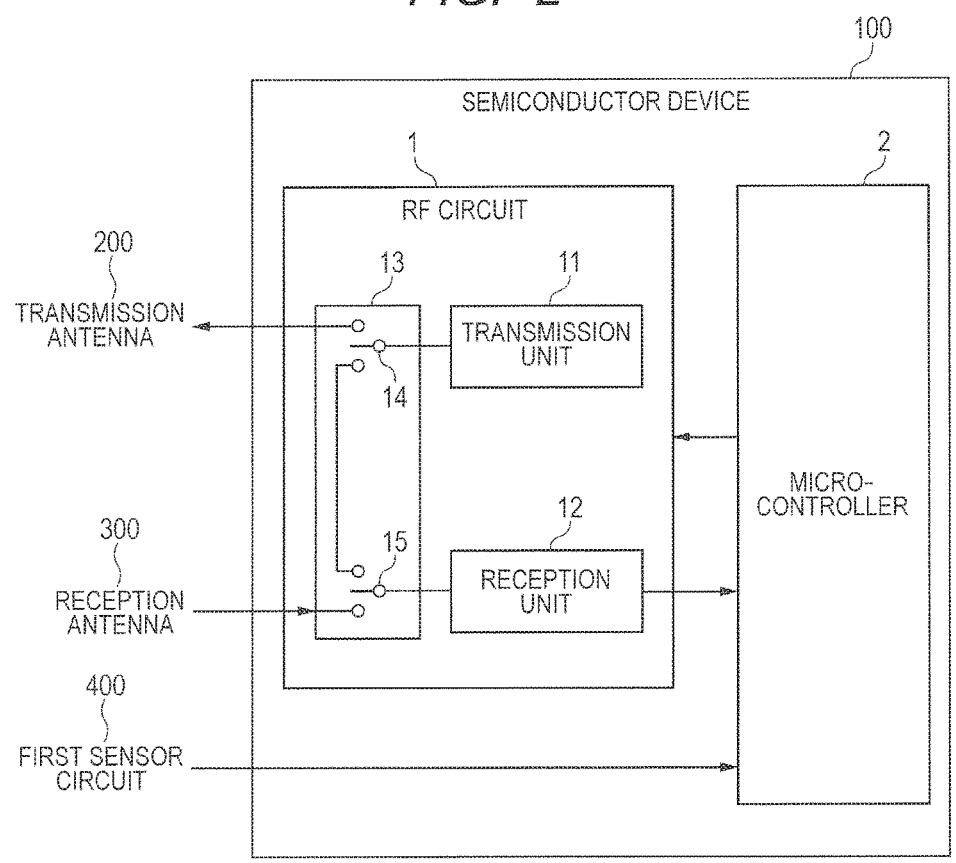
FIG. 2 is a block diagram illustrating a configuration example of a semiconductor device according to the embodiment.

Subsequently, using the block diagram of FIG. 2, a configuration example of the semiconductor device 100 according to the embodiment will be described. The semiconductor device 100 has an RF circuit 1 and a microcontroller 2. The RF circuit 1 has a transmission unit 11, a reception unit 12, and a transmission/reception loop-back switching unit 13.

The transmission unit 11 generates a transmission signal. The transmission unit 11 outputs the generated transmission signal to the transmission/reception loop-back switching unit 13.

The transmission/reception loop-back switching unit 13 switches between a first coupling state and a second coupling state by control of the microcontroller 2. The first coupling state is a state in which an output terminal of the transmission unit 11 is coupled to the transmission antenna 200, and an input terminal of the reception unit 12 is coupled to the reception antenna 300. The second coupling state is a state where the output terminal of the transmission unit 11 is coupled to the input terminal of the reception unit 12. A state where the transmission/reception loop-back switching unit 13 is in the first coupling state is called a normal operation mode. The normal operation mode is a mode of performing a normal transmission/reception operation by using the transmission antenna 200 and the reception antenna 300. A state where the transmission/reception loop-back switching unit 13 is in the second coupling state is called a test mode.

The test mode is a mode of performing a test without performing the normal transmission/reception operation using the transmission antenna 200 and the reception antenna 300.

Figure 3:
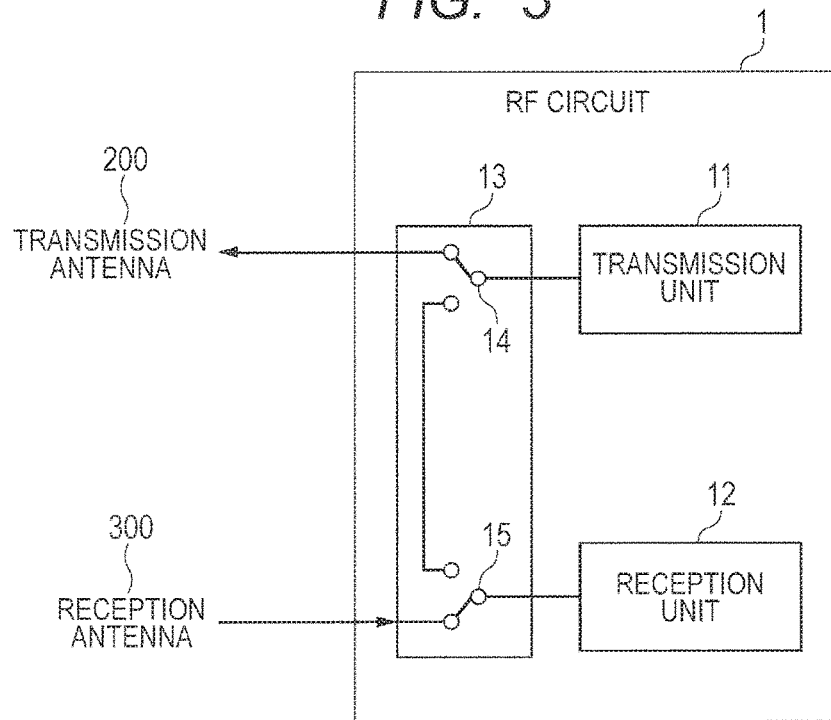
FIG. 3 is a diagram illustrating a state of a switch of a transmission/reception loop-back switching unit in a first connection state according to the embodiment.
Figure 4:
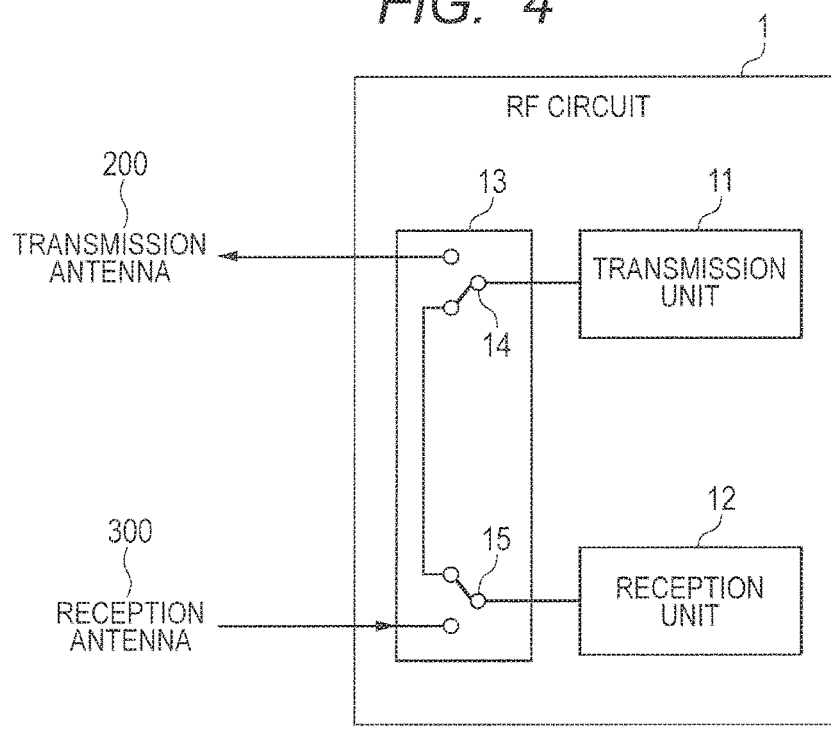
FIG. 4 is a diagram illustrating a state of a switch of a transmission/reception loop-back switching unit in a second connection state according to the embodiment.

The transmission/reception loop-back switching unit 13 has switches 14 and 15. The transmission/reception loop-back switching unit 13 switches between the first and second coupling states by the switches 14 and 15. Specifically, the transmission/reception loop-back switching unit 13 sets the switches 14 and 15 to the state of FIG. 3 in the first coupling state, and sets the switches 14 and 15 to the state of FIG. 4 in the second coupling state.

In the first coupling state, the transmission/reception loop-back switching unit 13 outputs the transmission signal received from the transmission unit 11 to the transmission antenna 200. In the first coupling state, the transmission/reception loop-back switching unit 13 outputs the reception signal received from the reception antenna 300 to the reception unit 12.

In the second coupling state, the transmission/reception loop-back switching unit 13 outputs the transmission signal received from the transmission unit 11 to the reception unit 12.

When the transmission/reception loop-back switching unit 13 is in the first coupling state, the reception unit 12 generates a first generation signal from the reception signal received from the transmission/reception loop-back switching unit 13. The reception unit 12 outputs the generated first generation signal to the microcontroller 2. When the transmission/reception loop-back switching unit 13 is in the second coupling state, the reception unit 12 generates a second generation signal from the transmission signal received from the transmission/reception loop-back switching unit 13. The reception unit 12 outputs the generated second generation signal to the microcontroller 2.

The process of the microcontroller 2 when the transmission/reception loop-back switching unit 13 is in the first coupling state will be described. The microcontroller 2 receives the first generation signal from the reception unit 12. The microcontroller 2 determines whether the first generation signal received from the reception unit 12 is normal or not. The microcontroller 2 determines whether the first generation signal is normal or not, for example, by detecting whether the frequency of the first generation signal lies in the normal range or not. That is, the microcontroller 2 determines that the first generation signal is normal when the frequency of the first generation signal is within the normal range, and determines that the first generation signal is not normal when the frequency of the first generation signal is out of the normal range. When the first generation signal is not normal, the microcontroller 2 switches the transmission/reception loop-back switching unit 13 to the second coupling state.

Subsequently, the process of the microcontroller 2 when the transmission/reception loop-back switching unit 13 is in the second coupling state will be described. The microcontroller 2 receives the second generation signal from the reception unit 12. The microcontroller 2 receives an output signal of the first sensor circuit 400. On the basis of the second generation signal received from the reception unit 12 and the output signal of the first sensor circuit 400, the microcontroller 2 performs a test of the RF circuit 1. The test of the RF circuit 1 based on the second generation signal when the transmission/reception loop-back switching unit 13 is in the second coupling state is also called a loop-back test of the RF circuit 1.

Concretely, when the transmission/reception loop-back switching unit 13 is in the second coupling state, in the case where the frequency of the second generation signal received from the reception unit 12 is out of the normal range and the output signal of the first sensor circuit 400 indicates detection of the target object, the microcontroller 2 executes the detailed test of the RF circuit 1. By the operation, in the semiconductor device 100, when the reception signal of the RF circuit 1 has abnormality in a state where the first sensor circuit 400 detects the target object, due to suspicion of abnormality in the RF circuit 1, the detailed test of the RF circuit 1 can be executed.

As the detailed test of the RF circuit 1, for example, a plurality of combinations of the frequency conditions of the transmission unit 11 and the reception unit 12 and conditions such as output power and phase of the transmission unit 11 are prepared, and the test of the RF circuit 1 is performed in all of the combinations of the conditions. A test other than the detailed test in the test mode will be also called a standard test.

Subsequently, using the flowchart of FIG. 5, an operation example of the semiconductor device 100 according to the embodiment will be described.

First, the semiconductor device 100 generates the first generation signal in the normal operation mode by the reception unit 12 (step S101).

Next, the semiconductor device 100 determines whether the first generation signal is normal or not by the microcontroller 2 (step S102).

Figure 5:
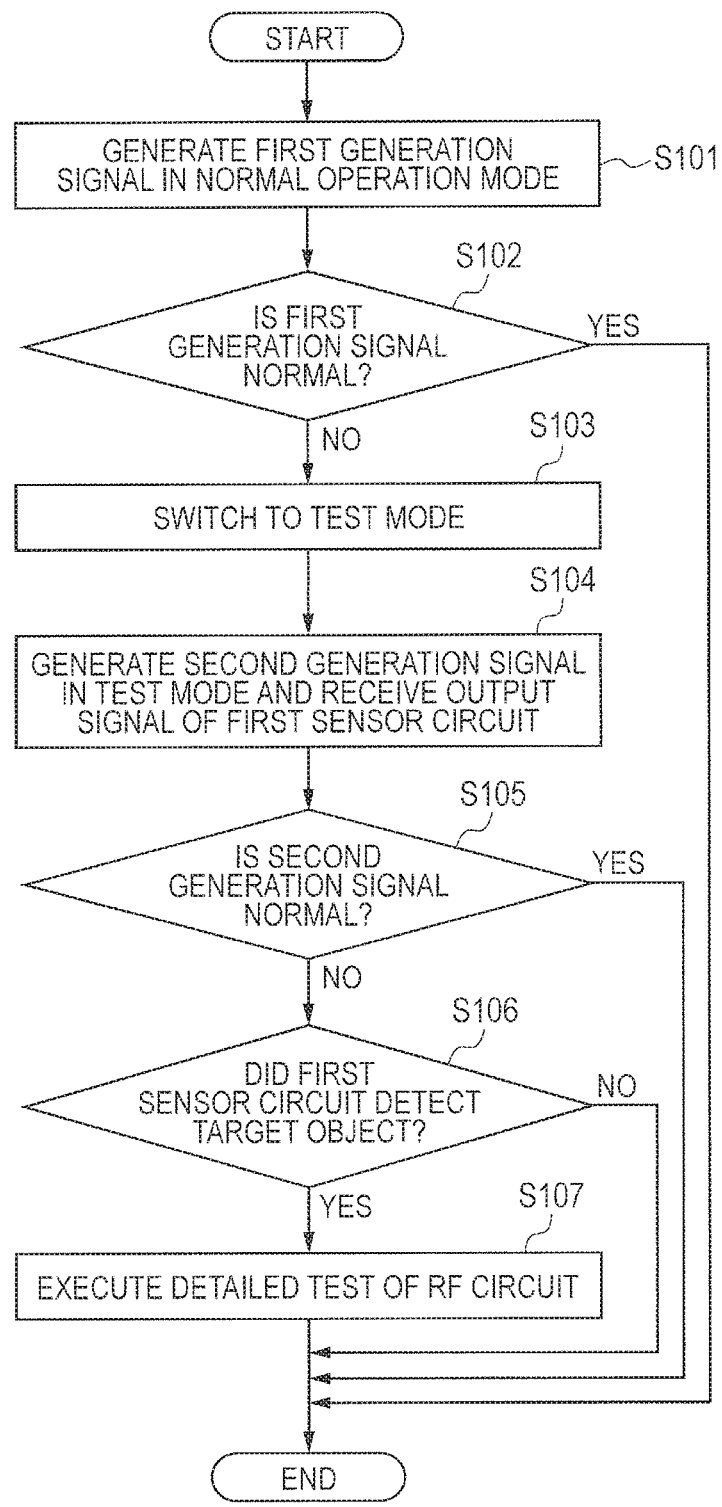
FIG. 5 is a flowchart illustrating an operation example of the semiconductor device according to the embodiment.

When the first generation signal is normal (YES in step S102), the semiconductor device 100 finishes the process of FIG. 5. On the other hand, when the first generation signal is not normal (NO in step S102), the semiconductor device 100 switches to the test mode by the microcontroller 2 (step S103).

Subsequently, the semiconductor device 100 generates the second generation signal in the test mode by the reception unit 12 and receives the output signal of the first sensor circuit 400 by the microcontroller 2 (step S104).

The semiconductor device 100 determines whether the second generation signal is normal or not by the microcontroller 2 (step S105).

When the second generation signal is normal (YES in step S105), the semiconductor device 100 finishes the processes in FIG. 5. On the other hand, when the second generation signal is not normal (NO in step S105), the semiconductor device 100 determines whether the output signal of the first sensor circuit 400 indicates detection of the target object or not by the microcontroller 2 (step S106).

When an output signal of the first sensor circuit 400 does not indicate detection of a target object (NO in step S106), the semiconductor device 100 finishes the process of FIG. 5. On the other hand, when the output signal of the first sensor circuit 400 indicates detection of the target object (YES in step S106), the semiconductor device 100 executes the detailed test of the RF circuit 1 (step S107).

As described above, the semiconductor device 100 according to the embodiment has the transmission/reception loop-back switching unit 13 switching between the first coupling state in which the output terminal of the transmission unit 11 is coupled to the transmission antenna 200, and the input terminal of the reception unit 12 is coupled to the reception antenna 300, and the second coupling state in which the output terminal of the transmission unit 11 is coupled to the input terminal of the reception unit 12. The semiconductor device 100 also has the microcontroller 2 which switches the transmission/reception loop-back switching unit 13 to the second coupling state in the case where the first generation signal when the transmission/reception loop-back switching unit 13 is in the first coupling state is not normal. The microcontroller 2 executes the test of the RF circuit 1 on the basis of the second generation signal when the transmission/reception loop-back switching unit 13 is in the second coupling state and the output signal of the first sensor circuit 400. Consequently, the semiconductor device 100 can automatically switch to the test mode when the generation signal generated by the reception unit 12 in the normal operation mode is not normal. The semiconductor device 100 executes the loop-back test of the RF circuit 1 in the test mode. Further, by using the output signal of the first sensor circuit 400 for the test of the RF circuit 1, the semiconductor device 100 can automatically detect a failure of the RF circuit 1 and abnormality as suspicion of a failure. That is, the semiconductor device 100 can realize the function safety.

When the transmission/reception loop-back switching unit 13 is in the second coupling state, in the case where the frequency of the second generation signal received from the reception unit 12 is out of the normal range and the output signal of the first sensor circuit 400 indicates detection of the target object, the semiconductor device 100 executes the detailed test of the RF circuit 1 by the microcontroller 2. By the operation, in the semiconductor device 100, when the reception signal of the RF circuit 1 has abnormality in a state where the first sensor circuit 400 detects the target object, due to suspicion of abnormality in the RF circuit 1, the detailed test of the RF circuit 1 can be executed.

As the detailed test, the semiconductor device 100 can prepare a plurality of combinations of the frequency conditions of the transmission unit 11 and the reception unit 12 and conditions such as output power and phase of the transmission unit 11, and executes the test of the RF circuit 1 in all of the combinations of the conditions. Consequently, in the semiconductor device 100, by executing the detailed test, a failure part can be narrowed down.

Further, in the semiconductor device 100, when it is determined that the RF circuit 1 is not abnormal, as there is suspicion of abnormality in the first sensor circuit 400, mutual diagnosis can be made.

First Embodiment

Figure 6:
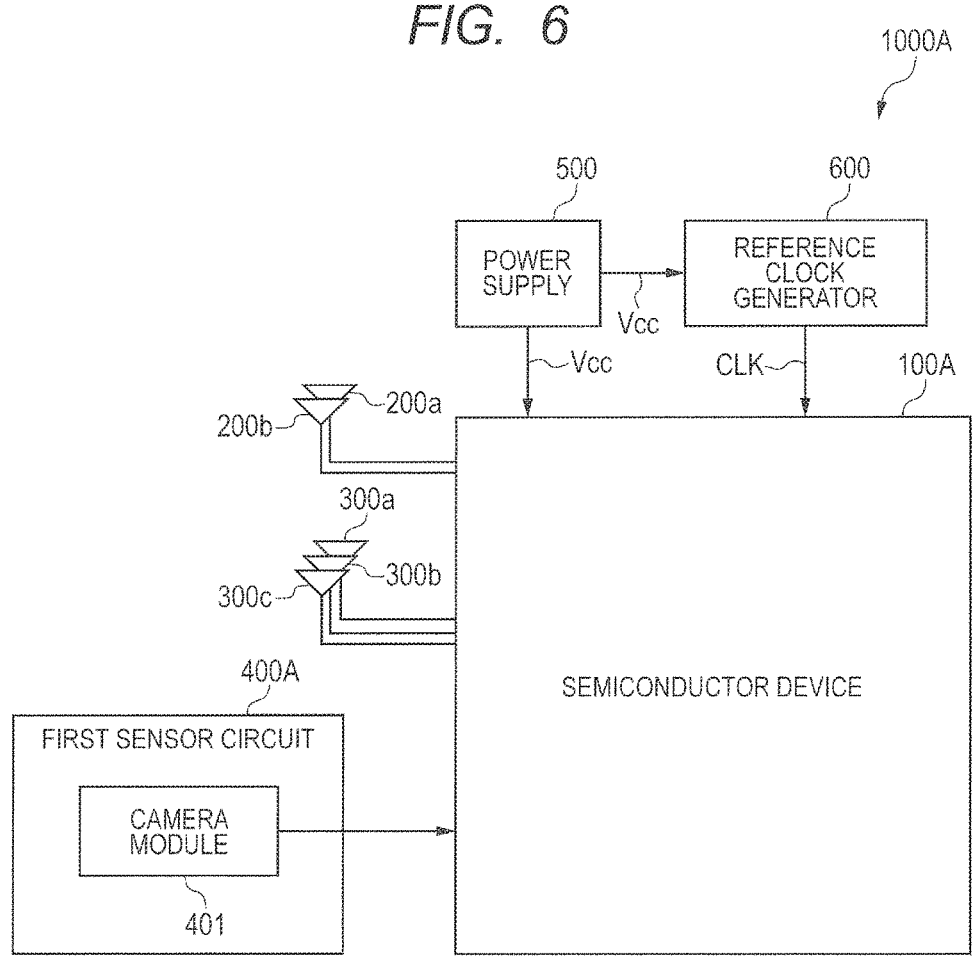
FIG. 6 is a block diagram illustrating a configuration example of a semiconductor system according to a first embodiment.

A first embodiment will now be described. FIG. 6 is a block diagram illustrating a configuration example of a semiconductor system 1000A according to a first embodiment. The semiconductor system 1000A is a semiconductor system mounted on a vehicle. The semiconductor system 1000A has a semiconductor device 100A, transmission antennas 200a and 200b, reception antennas 300a to 300c, a first sensor circuit 400A, a power supply 500, and a reference clock generator 600. The first sensor circuit 400A has a camera module 401. Although FIG. 6 illustrates an example that the first sensor circuit 400A has the camera module 401, the invention is not limited to the case. For example, the first sensor circuit 400A may have a laser module, or have both a camera module and a laser module. In the first embodiment, description will be given on assumption that the first generation signal is a first beat signal generated from the reception signal and the first clock signal, and the second generation signal is a second beat signal generated from the transmission signal and the second clock signal.

The transmission antennas 200a and 200b are antennas transmitting a transmission signal as a radar wave output from the semiconductor device 100A.

The reception antennas 300a to 300c receive a reception signal as a reflection wave obtained by reflecting the transmission signal transmitted from the transmission antennas 200a and 200b by the target object. The target object is an object around the vehicle, for example, an obstacle, a pedestrian, a white line indicating a traffic lane or a center divider, a sign, a signal, or the like. The reception antennas 300a to 300c output a reception signal to the semiconductor device 100A.

The camera module 401 is a sensor imaging a target object. The camera module 401 outputs an analog signal of the imaging result to the semiconductor device 100A.

The power supply 500 supplies voltage Vcc to the semiconductor device 100A and the reference clock generator 600. The reference clock generator 600 receives the voltage Vcc supplied and outputs a reference clock signal (CLK) to the semiconductor device 100A.

Figure 7:
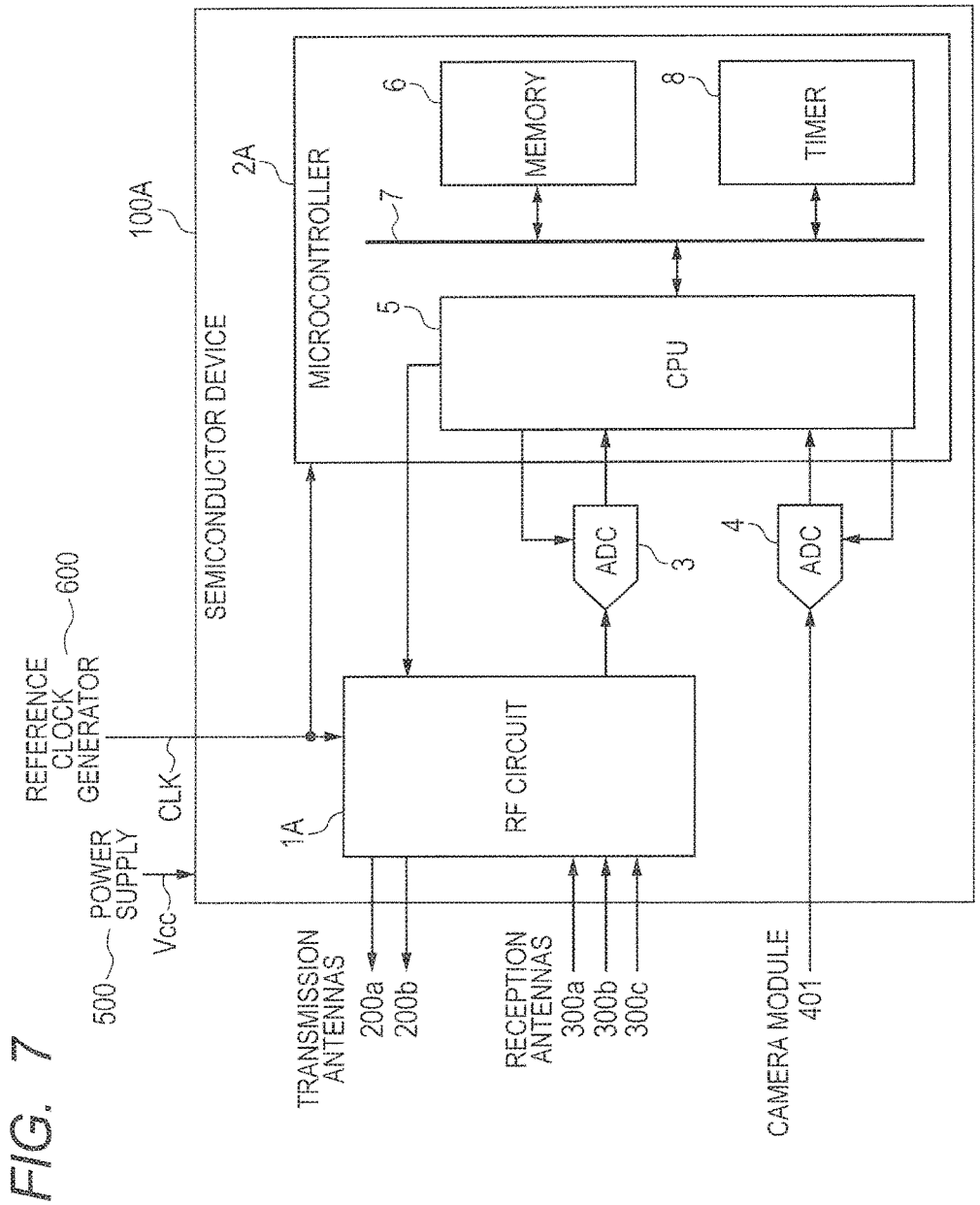
FIG. 7 is a block diagram illustrating a configuration example of a semiconductor device according to the first embodiment.

Subsequently, a configuration example of the semiconductor device 100A according to the first embodiment will be described with reference to the block diagram of FIG. 7. The semiconductor device 100A has an RF circuit 1A, a microcontroller 2A, an A/D converter (ADC) 3, and an A/D converter 4. The microcontroller 2A has a CPU (Central Processing Unit) 5, a memory 6, and a timer 8. The CPU 5, the memory 6, and the timer 8 are coupled via a bus 7. The memory 6 is a memory storing a program and data. A process by the CPU 5 is executed by executing a program storing in the memory 6. In the timer 8, counting time that counts a time interval (time between a regular test to a next regular test) for a regular test of the RF circuit 1A is set.

The reference clock signal output from the reference clock generator 600 is input to the RF circuit 1A and the microcontroller 2A.

The CPU 5 controls the RF circuit 1A and the A/D converters 3 and 4 by H/L-level-controlling a general port of the microcontroller 2A which is not written in the drawing (an external terminal of the microcontroller 2A).

The CPU 5 controls so as to start analog-to-digital conversion by the A/D converters 3 and 4. The control to start the analog-to-digital conversion by the A/D converters 3 and 4 is also called conversion start control. The CPU 5 controls to supply a conversion clock signal to the A/D converters 3 and 4, as a clock signal necessary to analog-to-digital conversion in the A/D converters 3 and 4.

The RF circuit 1A outputs an analog signal of a beat signal to the A/D converter 3. The A/D converter 3 receives the analog signal of the beat signal from the RF circuit 1A. The A/D converter 3 receives the conversion start control from the CPU 5, converts the analog signal of the beat signal to a digital signal, and generates a first conversion data signal. The A/D converter 3 outputs the first conversion data signal and a conversion end signal to the CPU 5. The conversion end signal is a signal for notifying the CPU 5 of the end of the conversion.

The A/D converter 4 receives an analog signal of the imaging result from the camera module 401. The A/D converter 4 receives the conversion start control from the CPU 5, converts an analog signal of the imaging result to a digital signal, and generates a second conversion data signal. The A/D converter 3 outputs the second conversion data signal and the conversion end signal to the CPU 5.

The CPU 5 receives the first conversion data signal and the conversion end signal from the A/D converter 3 and stores the first conversion data signal into the memory 6. The CPU receives the second conversion data signal and the conversion end signal from the A/D converter 4 and stores the second conversion data signal into the memory 6. Further, the CPU 5 reads the first and second conversion data signals stored in the memory 6 and analyzes the data.

Concretely, in the normal operation mode, the CPU 5 checks whether the beat frequency of the first conversion data signal is within a predetermined normal range or not by performing frequency analysis by general fast Fourier transformation analysis on the first conversion data signal. When the beat frequency of the first conversion data signal is out of the predetermined normal range, the CPU 5 turns on an abnormality flag prepared in the register in the CPU 5 and shifts to a test mode. When the beat frequency of the first conversion data signal lies within the predetermined normal range, for example, when it is a beat frequency in an in-vehicle radar, the CPU 5 extracts position information from the analysis result.

Not only in the case where the beat frequency of the first conversion data signal is out of a predetermined normal range but also the case where the timer 8 executes a regular test, the CPU 5 shifts to the test mode. When the timer 8 is not finished (does not indicate time to execute the regular test), the CPU 5 also checks whether there is a sequence stop interruption by power supply stop or the like to the CPU 5.

In the test mode, the CPU 5 checks whether the beat frequency of the first conversion data signal is within the predetermined normal range or not by performing the frequency analysis by the general fast Fourier transformation analysis on the first conversion data signal. When the beat frequency of the first conversion data signal is in the predetermined normal range, the CPU 5 performs a test pass process such as storage of a test pass result into the memory 6. When the beat frequency of the first conversion data signal is out of the predetermined normal range, the CPU 5 checks an abnormality flag set in the normal operation mode. When the abnormality flag is OFF, the CPU 5 performs a test error process. As the test error process, for example, test error process 1 or 2 which will be described below may be performed. When the CPU 5 determines that there is abnormality in the RF circuit 1A and operation is not reliable, use of the RF circuit 1A is stopped (test error process 1). A signal notifying of abnormality detection is output from the microcontroller 2A to the outside (test error process 2). By executing the test error process 2, for example, a system monitoring microcomputer on the outside may receive the signal notifying of abnormality detection and reset the semiconductor device 100A. In this case, not abnormality of the RF circuit 1A but an error as a signal obtained by OR with error information related to function safety of another function circuit may be notified. As the test error process, in addition to the above-described process, a test error result may be stored in the memory 6.

In the test mode, the CPU 5 analyzes the second conversion data signal and, by checking the analysis result, determines whether the target object is detected by the camera module 401 or not. When the target object is detected by the camera module 401 and the abnormality flag is ON, the CPU 5 executes the detailed test. In the detailed test, for example, tests are executed in all of conditions of a table illustrated in FIG. 8. The detailed test is executed as a loop-back test in a manner similar to the standard test. All of test results under the conditions are stored in the memory 6 via the bus 7. The CPU 5 reads results stored in the memory 6 and determines the presence/absence of abnormality. When abnormality is found in a test result, the CPU 5 performs a test error process according to the error found.

Figure 9:
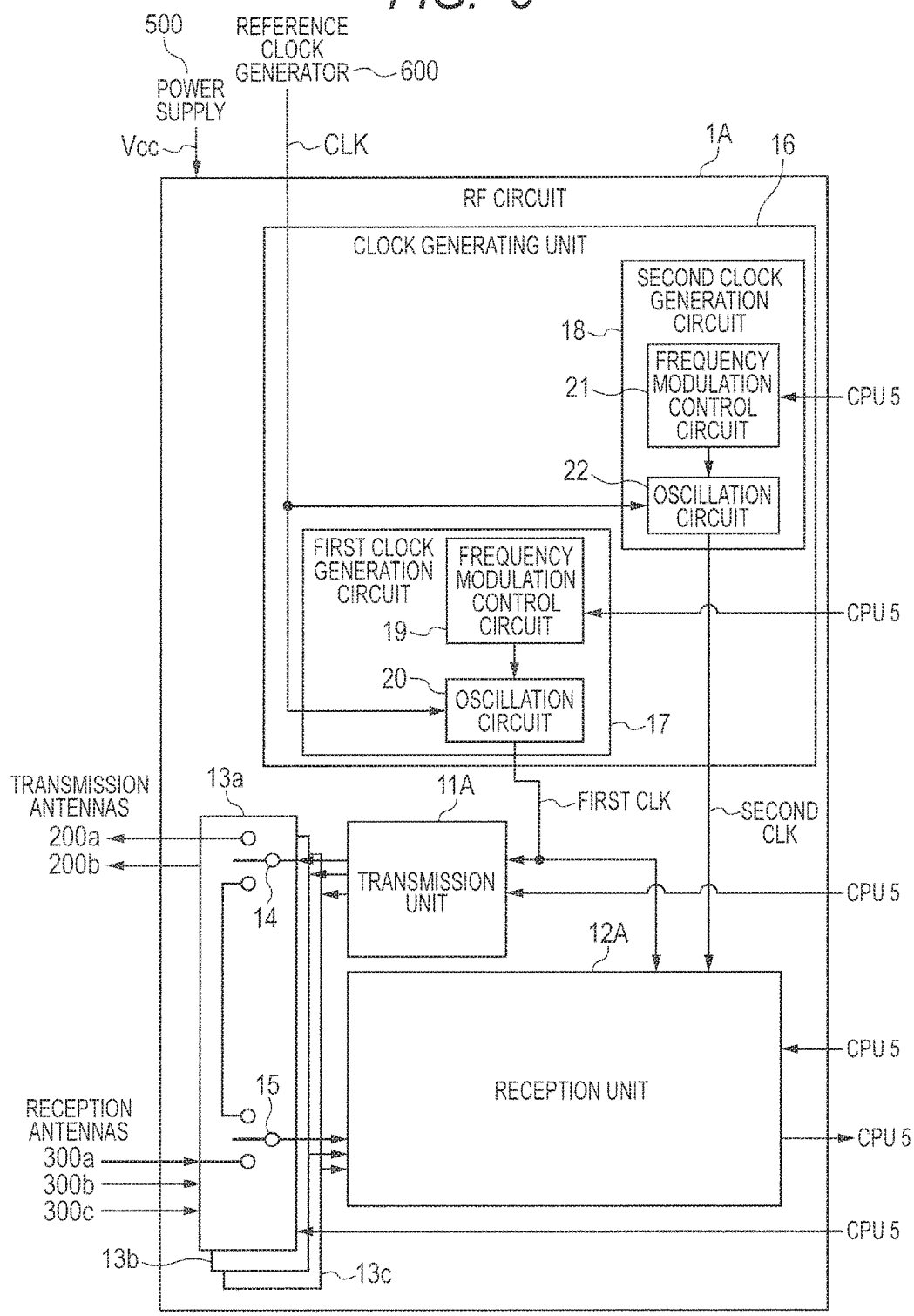
FIG. 9 is a block diagram illustrating a configuration example of an RF circuit according to the first embodiment.

Subsequently, using the block diagram of FIG. 9, a configuration example of the RF circuit 1A according to the first embodiment will be described. The RF circuit 1A has a transmission unit 11A, a reception unit 12A, transmission/reception loop-back switching units 13a to 13c, and a clock generation unit 16. The clock generation unit 16 has a first clock generation circuit 17 and a second clock generation circuit 18. The first clock generation circuit 17 is a circuit generating a first clock signal (first CLK). The second clock generation circuit 18 is a circuit generating a second clock signal (second CLK) which is necessary in a loop-back test of the RF circuit 1A.

The first clock generation circuit 17 has a frequency modulation control circuit 19 and an oscillation circuit 20. The second clock generation circuit 18 has a frequency modulation control circuit 21 and an oscillation circuit 22. A reference clock signal output from the reference clock generator 600 is input to the oscillation circuits 20 and 22.

The frequency modulation control circuit 19 receives control for setting the frequency value of the first clock signal output from the oscillation circuit 20 from the CPU 5. The control for setting the frequency value of the first clock signal is also called RF function control. By the RF function control from the CPU 5, the frequency modulation control circuit 19 generates a first clock signal from the reference clock signal which is input to the oscillation circuit 20. The oscillation circuit 20 outputs the first clock signal to the transmission unit 11A and the reception unit 12A.

The frequency modulation control circuit 21 receives control for setting the frequency value of the second clock signal output from the oscillation circuit 22 from the CPU 5. The control for setting the frequency value of the second clock signal is also called RF function control. By the RF function control from the CPU 5, the frequency modulation control circuit 21 generates a second clock signal from the reference clock signal which is input to the oscillation circuit 22. The oscillation circuit 22 outputs the second clock signal to the reception unit 12A.

Figure 10:
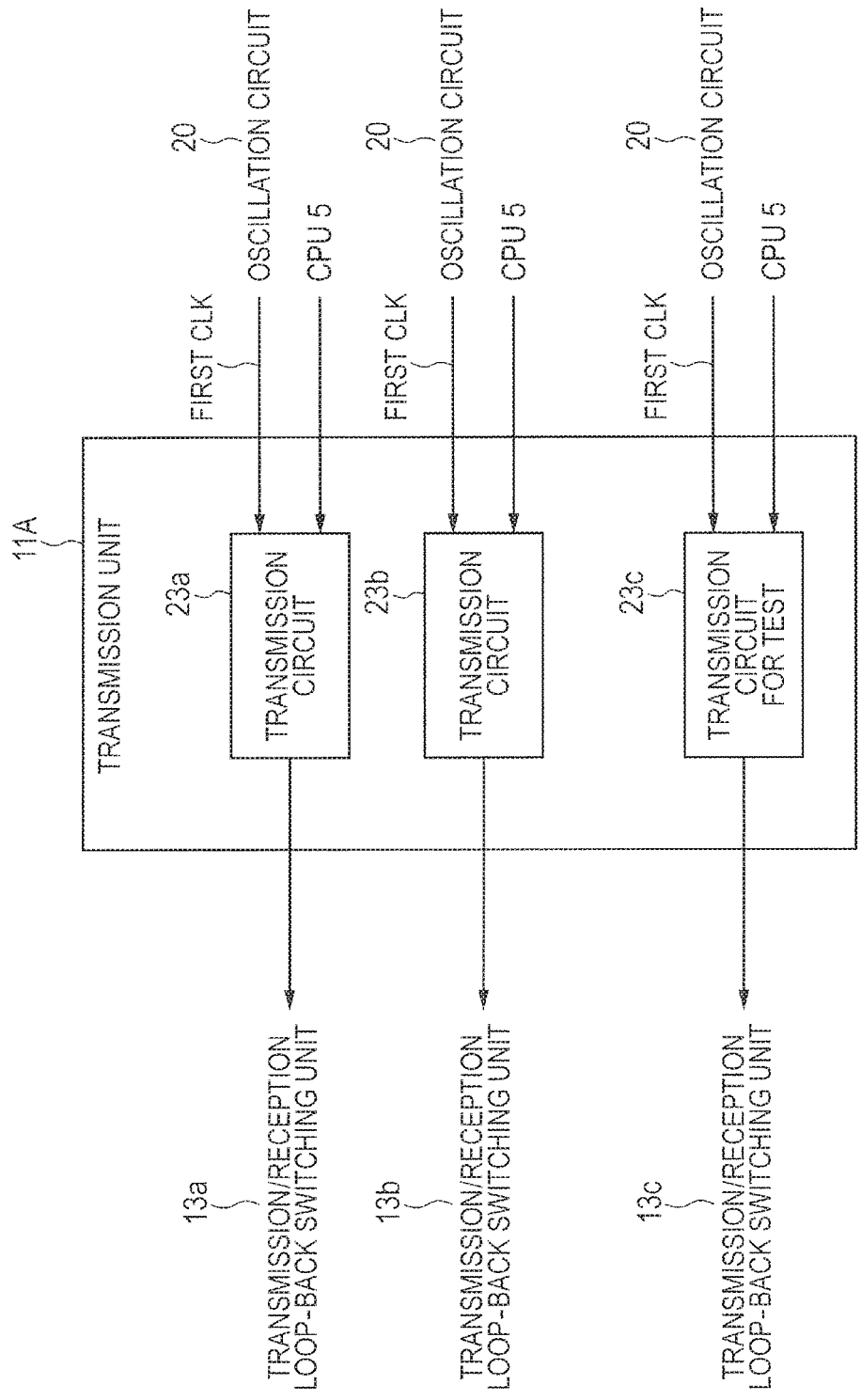
FIG. 10 is a block diagram illustrating a configuration example of a transmission unit according to the first embodiment.

Referring to the block diagram of FIG. 10, a configuration example of the transmission unit 11A according to the first embodiment will be described. The transmission unit 11A has transmission circuits 23a and 23b and a transmission circuit 23c for test.

The transmission circuits 23a and 23b are transmission circuits used in both the normal operation mode and the test mode. The transmission circuits 23a and 23b receive, from the CPU 5, the first clock signal from the oscillation circuit 20. The transmission circuits 23a and 23b receive the control for setting the phase of the transmission circuits 23a and 23b and the power amplifier output power of the transmission circuits 23a and 23b. The control for setting the phase of the transmission circuits 23a and 23b and the power amplifier output power of the transmission circuits 23a and 23b is also called RF function control. The transmission circuit 23a generates an analog transmission signal from the first clock signal by the RF function control from the CPU 5 and outputs it to the transmission/reception loop-back switching unit 13a. The transmission circuit 23b generates an analog transmission signal from the first clock signal by the RF function control from the CPU 5 and outputs it to the transmission/reception loop-back switching unit 13b.

The transmission circuit 23c for test is a transmission circuit used in the test mode and is a transmission circuit for matching the number of transmission circuits and the number of reception circuits. In the first embodiment, the case where the number of transmission circuits and the number of reception circuits used in the normal operation mode are two and three, respectively, will be described. Consequently, one transmission circuit is provided as the transmission circuit 23c for test.

The transmission circuit 23c for test receives a first clock signal from the oscillation circuit 20. The transmission circuit 23c for test receives the control for setting the phase of the transmission circuit 23c for test and the power amplifier output power of the transmission circuit 23c for test from the CPU 5. The control for setting the phase of the transmission circuit 23c for test and the power amplifier output power of the transmission circuit 23c for test is also called RF function control. The transmission circuit 23c for test generates an analog transmission signal from the first clock signal by the RF function control from the CPU 5 and outputs it to the transmission/reception loop-back switching unit 13a.

Referring again to FIG. 9, description will be continued. By receiving the control from the CPU 5, the transmission/reception loop-back switching units 13a to 13c switch the switches 14 and 15. The control of switching the switches 14 and 15 is also called loop-back ON/OFF control. Concretely, when the loop-back OFF control is received from the CPU 5, each of the transmission/reception loop-back switching units 13a to 13c makes its switches 14 and 15 set for the normal operation mode. When the loop-back ON control is received from the CPU 5, each of the transmission/reception loop-back switching units 13a to 13c makes its switches 14 and 15 set for the test mode.

In the normal operation mode, the transmission/reception loop-back switching unit 13a outputs an analog transmission signal received from the transmission circuit 23a to the transmission antenna 200a and outputs an analog reception signal received from the reception antenna 300a to the reception unit 12A. In the test mode, the transmission/reception loop-back switching unit 13a outputs the analog transmission signal received from the transmission circuit 23a to the reception unit 12A.

In the normal operation mode, the transmission/reception loop-back switching unit 13b outputs an analog transmission signal received from the transmission circuit 23b to the transmission antenna 200b and outputs an analog reception signal received from the reception antenna 300b to the reception unit 12A. In the test mode, the transmission/reception loop-back switching unit 13b outputs the analog transmission signal received from the transmission circuit 23b to the reception unit 12A.

In the normal operation mode, the transmission/reception loop-back switching unit 13c outputs an analog transmission signal received from the reception antenna 300c to the reception unit 12A. In the test mode, the transmission/reception loop-back switching unit 13c outputs the analog transmission signal received from the transmission circuit 23c for test to the reception unit 12A.

Figure 11:
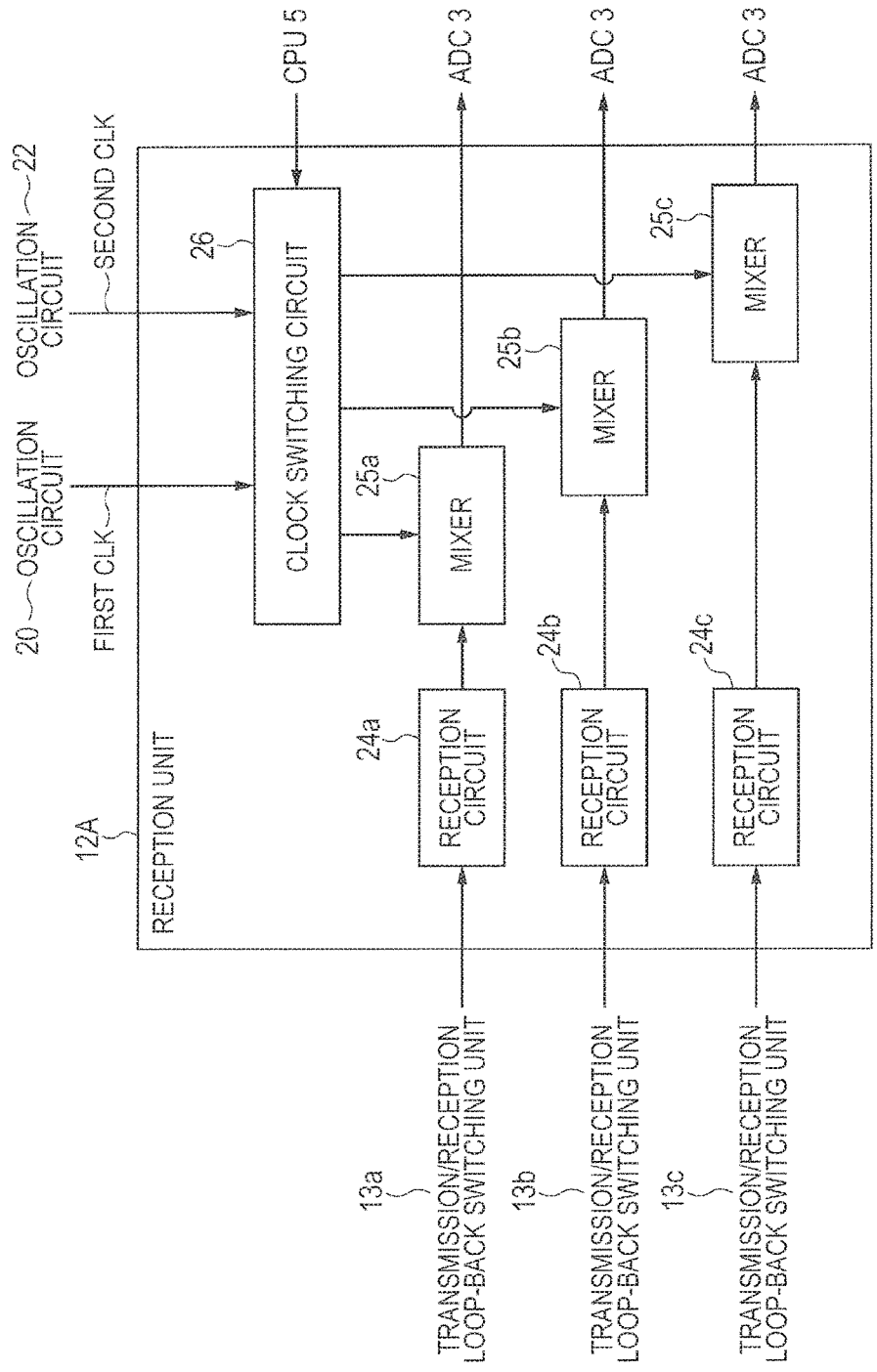
FIG. 11 is a block diagram illustrating a configuration example of a reception unit according to the first embodiment.

Subsequently, referring to the block diagram of FIG. 11, a configuration example of the reception unit 12A according to the first embodiment will be described. The reception unit 12A has reception circuits 24a to 24c, mixers 25a to 25c, and a clock switching circuit 26.

The reception circuits 24a to 24c are reception circuits used in both the normal operation mode and the test mode. In the normal operation mode, the reception circuit 24a receives an analog reception signal from the transmission/reception loop-back switching unit 13a. The reception circuit 24a adjusts the received analog reception signal and outputs the resultant signal to the mixer 25a. The adjustment of the signal in the reception circuit is normal adjustment performed by using an amplifier and a filter and its description will not be given. In the test mode, the reception circuit 24a receives an analog transmission signal from the transmission/reception loop-back switching unit 13a. The reception circuit 24a adjusts the received analog transmission signal and outputs the resultant signal to the mixer 25a.

In the normal operation mode, the reception circuit 24b receives an analog reception signal from the transmission/reception loop-back switching unit 13b. The reception circuit 24b adjusts the received analog reception signal and outputs the adjusted signal to the mixer 25b. In the test mode, the reception circuit 24b receives the analog transmission signal from the transmission/reception loop-back switching unit 13b. The reception circuit 24b adjusts the received analog transmission signal and outputs the adjusted signal to the mixer 25b.

In the normal operation mode, the reception circuit 24c receives an analog reception signal from the transmission/reception loop-back switching unit 13c. The reception circuit 24c adjusts the received analog reception signal and outputs the adjusted signal to the mixer 25c. In the test mode, the reception circuit 24c receives an analog transmission signal from the transmission/reception loop-back switching unit 13c. The reception circuit 24c adjusts the received analog transmission signal and outputs the adjusted signal to the mixer 25c.

The clock switching circuit 26 receives a first clock signal from the oscillation circuit 20. The clock switching circuit 26 receives a second clock signal from the oscillation circuit 22. Further, the clock switching circuit 26 receives control of designation to choose either the first clock signal or the second clock signal from the CPU 5. The control of designation to choose either the first clock signal or the second clock signal is also called an RF function control. By the RF function control from the CPU 5, the clock switching circuit 26 selects either the first clock signal or the second clock signal. Concretely, in the normal operation mode, the clock switching circuit 26 selects the first clock signal and outputs it to the mixers 25a to 25c. In the test mode, the clock switching circuit 26 selects the second clock signal and outputs it to the mixers 25a to 25c.

The mixers 25a to 25c mix analog signals received from the reception circuits 24a to 24c and clock signals received from the clock switching circuit 26, thereby generating an analog signal having a differential frequency (beat frequency) between the analog signal and the clock signal. Concretely, in the normal operation mode, the mixers 25a to 25c mix the analog reception signal and the first clock signal to generate a first beat signal. In the test mode, the mixers 25a to 25c mix the analog transmission signal and the second clock signal to generate a second beat signal. The mixers 25a to 25c output the generated beat signals to the A/D converter 3.

The reason for using the second clock signal will be described. The frequency of an analog reception signal and that of an analog transmission signal are different from each other. It happens because the frequency changes when an analog transmission signal is reflected by an object. To make a frequency set value of a beat signal generated by the reception unit 12A in the test mode and a frequency set value of a beat signal generated by the reception unit 12A in the normal operation mode the same value, it is necessary to make a difference between the frequency set value of a second clock signal and that of a first clock signal by the amount of the frequency difference between the analog reception signal and the analog transmission signal. Consequently, a second clock signal in which the frequency difference from a first clock signal is set is used. By preparing a plurality of frequency set values of second clock signals and executing a test for each of them, a detailed test under a plurality of conditions can be executed.

Figure 12:
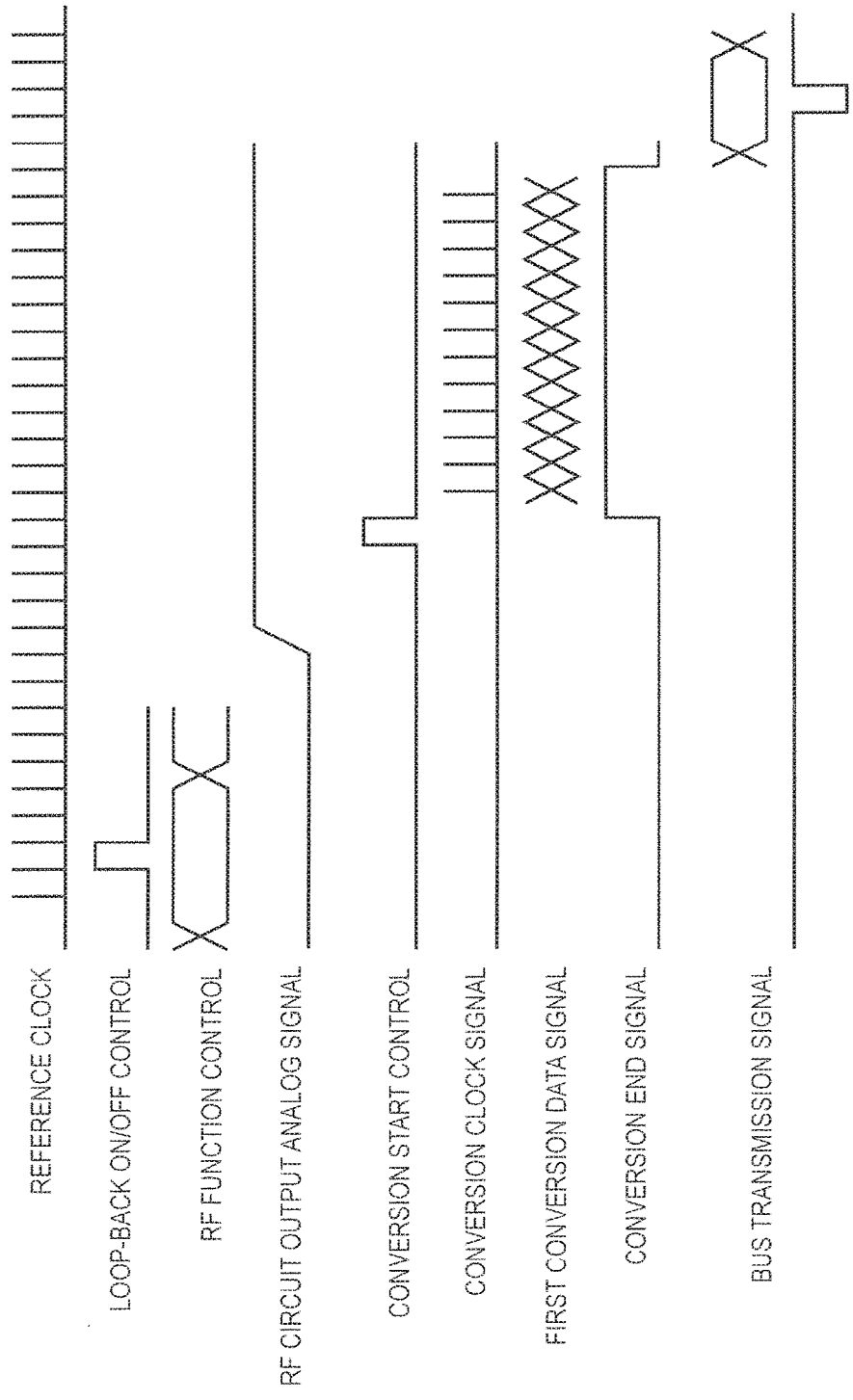
FIG. 12 is a diagram illustrating an example of the operation waveforms of signals according to the first embodiment.
Figure 13:
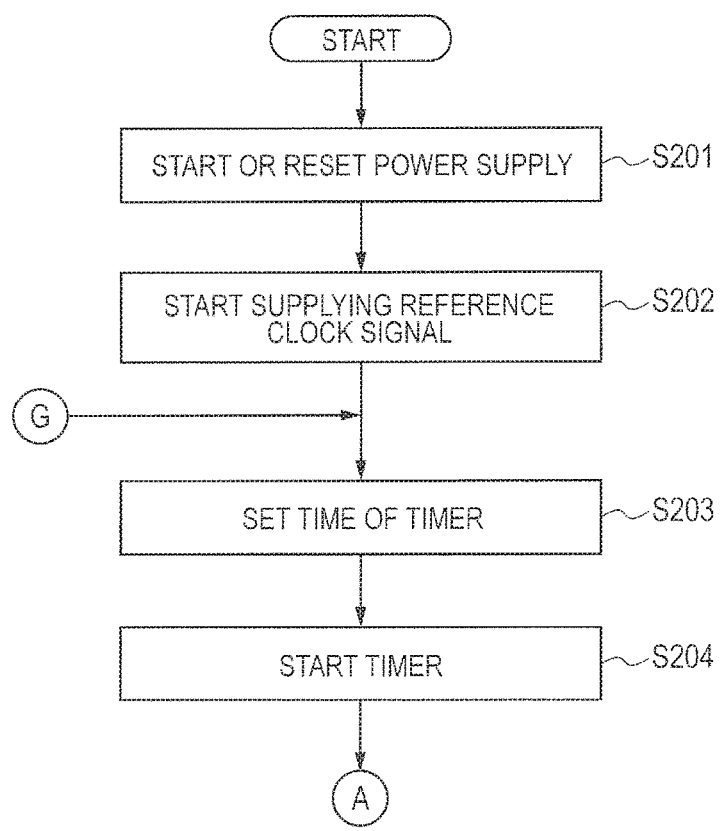
FIG. 13 is a flowchart illustrating an operation example of the semiconductor device according to the first embodiment.

An example of the operation waves of signals according to the first embodiment is illustrated in FIG. 12. FIG. 12 illustrates an example of the operation waveforms of reference clock, loop-back ON/OFF control, RF function control, output analog signal of the RF circuit 1A, conversion start control, conversion clock signal, first conversion data signal, conversion end signal, and bus 7 transmission signal.

Figure 14:
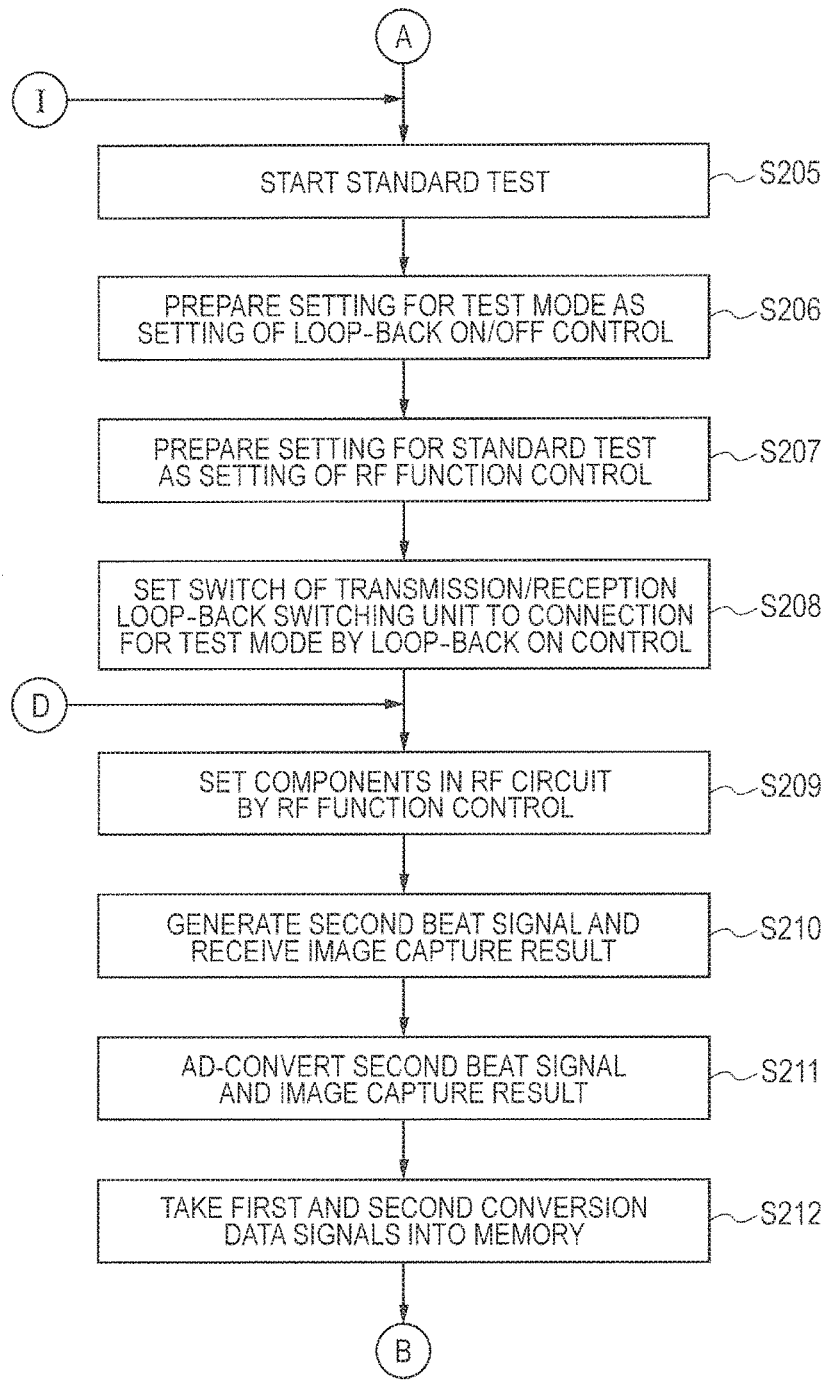
FIG. 14 is a flowchart illustrating an operation example of the semiconductor device according to the first embodiment.
Figure 15:
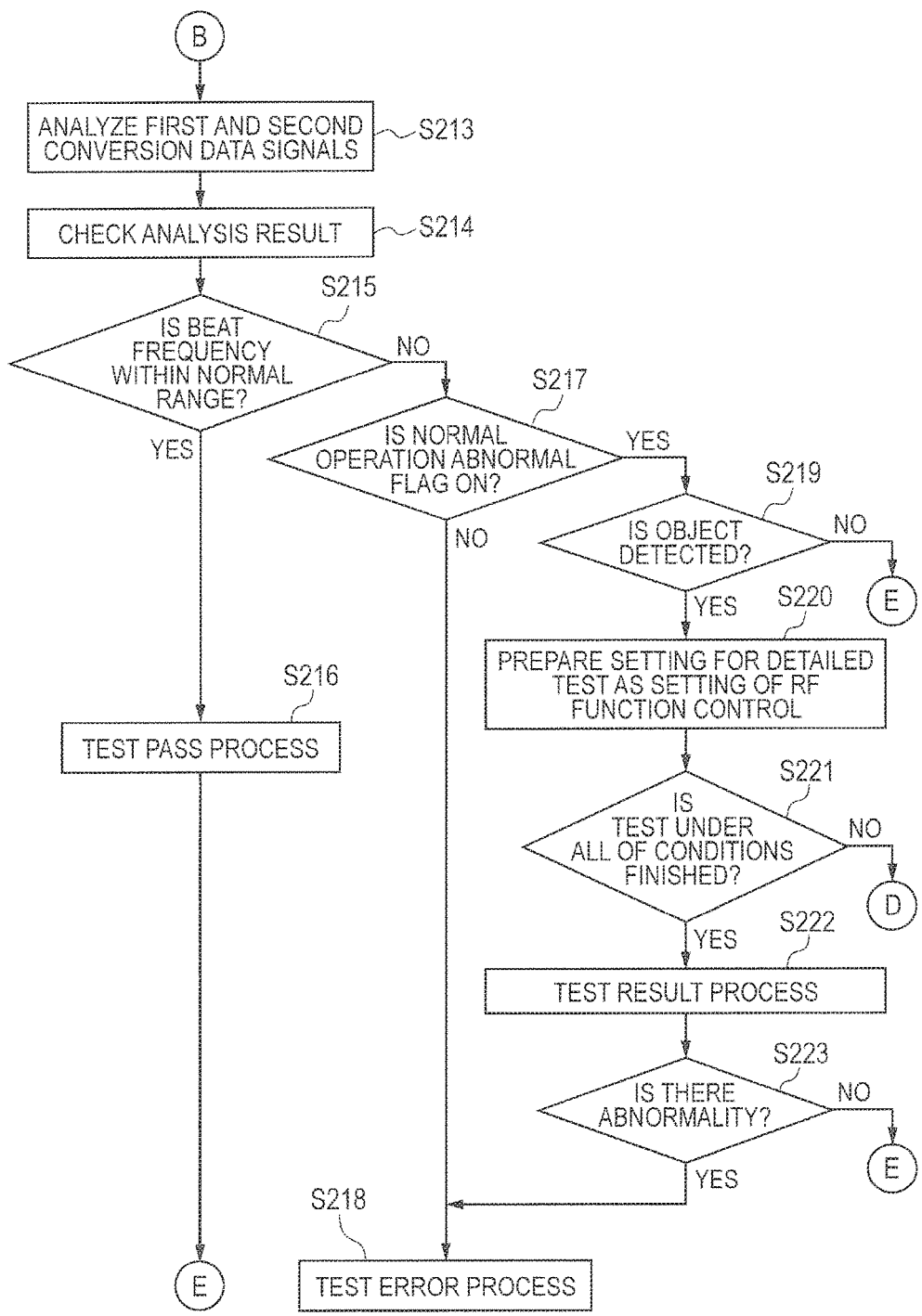
FIG. 15 is a flowchart illustrating an operation example of the semiconductor device according to the first embodiment.
Figure 16:
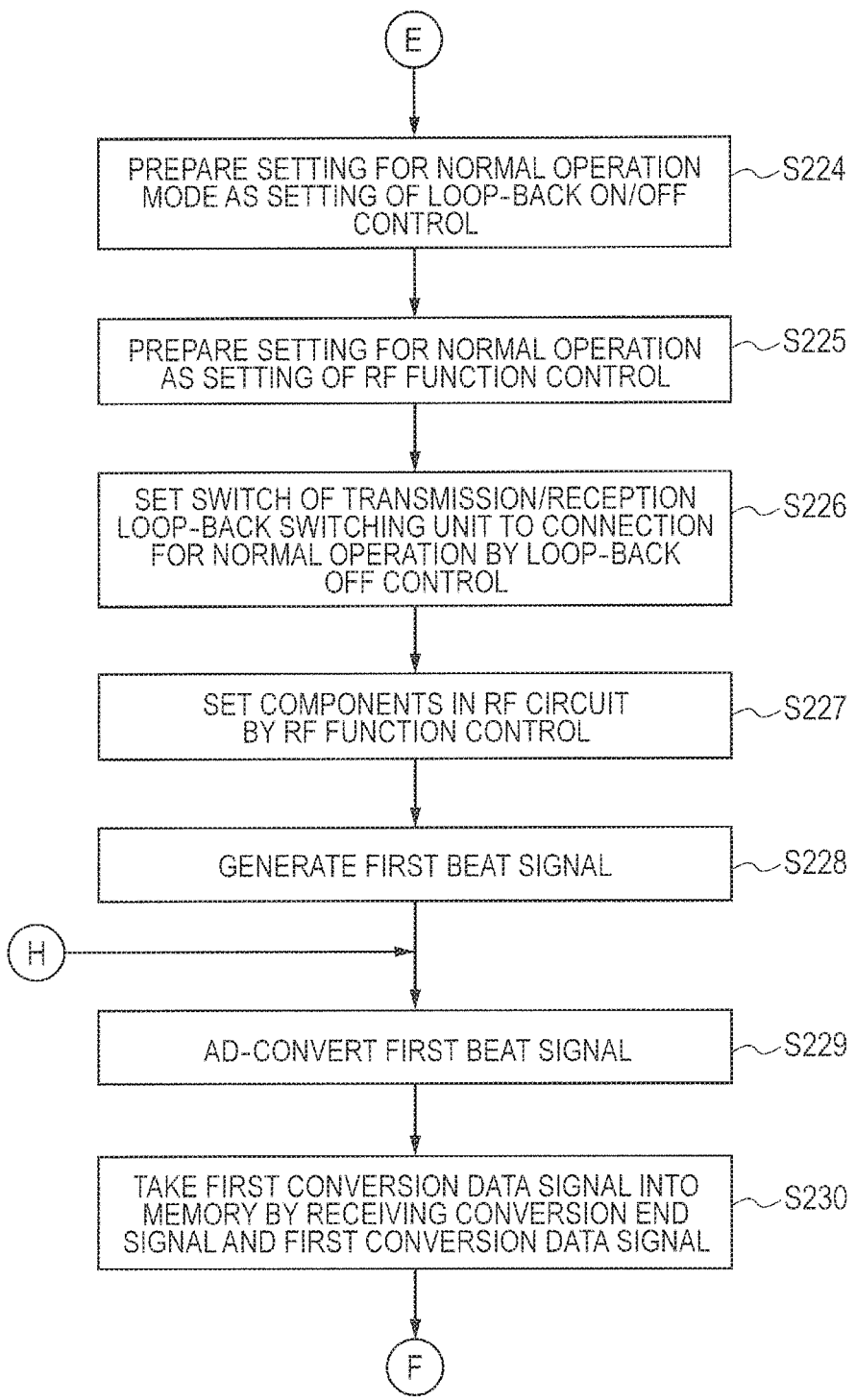
FIG. 16 is a flowchart illustrating an operation example of the semiconductor device according to the first embodiment.
Figure 17:
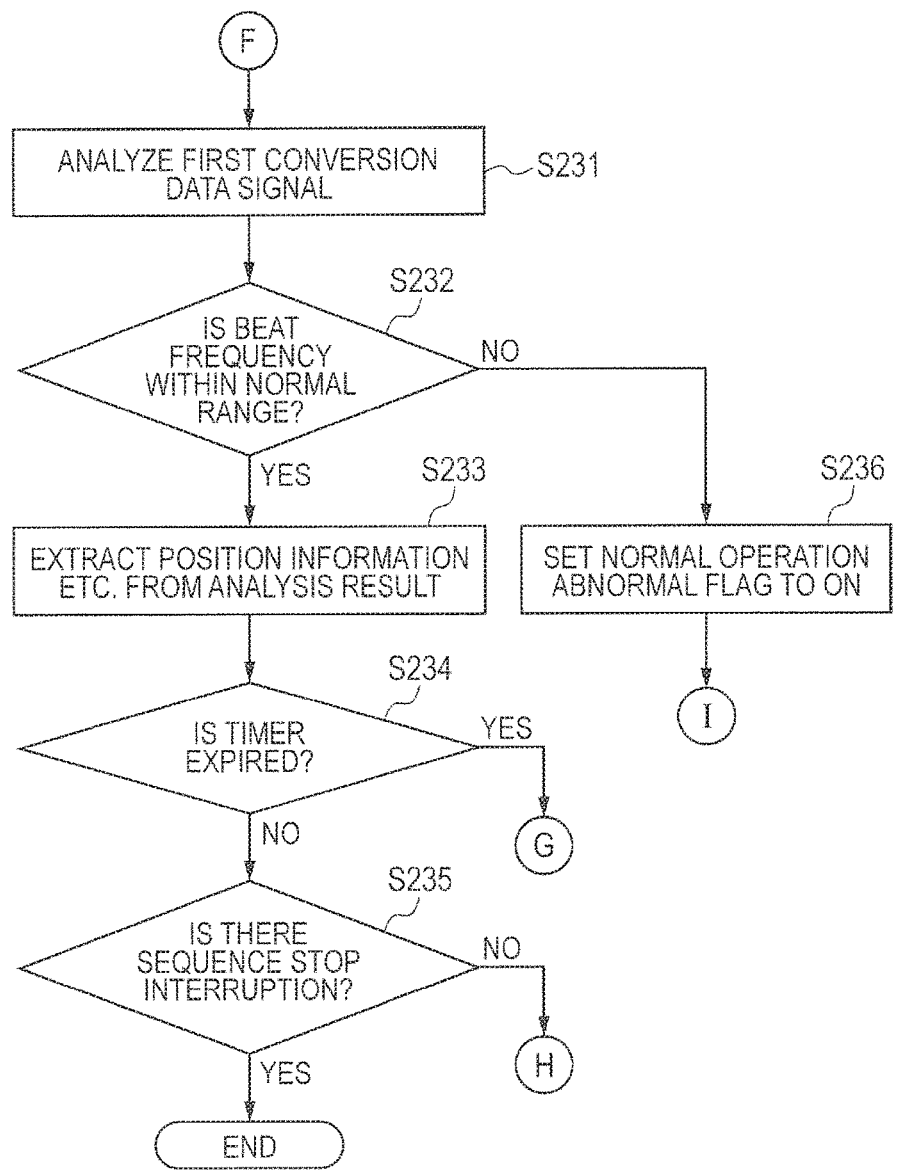
FIG. 17 is a flowchart illustrating an operation example of the semiconductor device according to the first embodiment.

Referring not to flowcharts of FIGS. 13 to 17, an operation example of the semiconductor device 100A according to the first embodiment will be described. FIGS. 14 and 15 illustrate operation examples in the test mode, and FIGS. 16 and 17 illustrate operation examples in the normal operation mode. In the following description, operations executed in response to reset at the time of power on (power-on reset) will be described as an example. Also in the case where reset is executed during operation (during current passage) of the microcontroller 2A, similar operations are performed.

First, when power supply of the voltage Vcc is started by the power supply 500 to the semiconductor device 100A and the reference clock generator 600 (step S201), oscillation of a reference clock is started by the reference clock generator 600, and a reference clock signal is supplied to the RF circuit 1A and the microcontroller 2A (step S202).

Next, the semiconductor device 100A sets counting time that counts a time interval for a regular test of the RF circuit 1A in the timer 8 using the reference clock signal as a reference by the CPU 5 (step S203). Subsequently, the semiconductor device 100A starts the timer 8 by the CPU 5 (step S204) and starts a standard test (step S205). A standard test started on the basis of the timer 8 is a regular test.

The semiconductor device 100A prepares setting for a test mode in the CPU 5 as a setting of the loop-back ON/OFF control (step S206). That is, the semiconductor device 100A prepares a setting for the loop-back ON control indicating ON of a loop-back.

The semiconductor device 100A prepares a setting for a standard test in the CPU 5 as setting of the RF function control (step S207). The setting for the standard test of the RF function control to the frequency modulation control circuit 19 (the oscillation circuit 20), the frequency modulation control circuit 21 (the oscillation circuit 22), the transmission circuits 23a and 23b, and the transmission circuit 23c for test is, for example, setting of a predetermined condition as any of conditions 1 to "n" in FIG. 8. The setting for the standard test of the RF function control for the clock switching circuit 26 is setting of designating selection of the second clock signal.

Next, the semiconductor device 100A sets the switches 14 and 15 of each of the transmission/reception loop-back switching units 13a to 13c to coupling for the test mode by executing the loop-back ON control by the CPU 5 (step S208).

Next, the semiconductor device 100A sets each of the components in the RF circuit 1A by executing the RF function control by the CPU 5 (step S209). The components in the RF circuit 1A are the frequency modulation control circuit 19 (the oscillation circuit 20), the frequency modulation control circuit 21 (the oscillation circuit 22), the transmission circuits 23a and 23b, the transmission circuit 23c for test, and the clock switching circuit 26.

The semiconductor device 100A generates a second beat signal by the reception circuits 24a to 24c and the mixers 25a to 25c and receives an imaging result from the camera module 401 by the CPU 5 (step S210).

The semiconductor device 100A analog-to-digital-converts each of the second beat signal and the imaging result by executing the conversion start control by the CPU 5 (step S211). A signal obtained by digital-converting the second beat signal is a first conversion data signal, and a signal obtained by digital-converting the imaging result is a second conversion data signal.

When the CPU 5 receives the conversion end signal and the first and second conversion data signals, the semiconductor device 100A fetches the first and second conversion data signals into the memory 6 (step S212).

The semiconductor device 100A analyzes the first and second conversion data signals by the CPU 5 (step S213) and checks each of analysis results (step S214).

The semiconductor device 100A determines whether the beat frequency of the first conversion data signal lies within the normal range or not by the CPU 5 (step S215).

When the beat frequency of the first conversion data signal lies within the normal range (YES in step S215), the semiconductor device 100A performs a test pass process by the CPU 5 (step S216). On the other hand, when the beat frequency of the first conversion data signal lies out of the normal range (NO in step S215), the semiconductor device 100A determines whether the normal operation abnormality flag is ON or not by the CPU 5 (step S217).

When the normal operation abnormality flag is OFF (NO in step S217), the semiconductor device 100A performs a test error process (step S218). On the other hand, when the normal operation abnormality flag is ON (YES in step S217), the semiconductor device 100A determines whether the second conversion data signal indicates detection of a target object or not by the CPU 5 (step S219).

When the second conversion data signal indicates detection of a target object (YES in step S219), the semiconductor device 100A prepares a setting for the detailed test in the CPU 5 as a setting of the RF function control (step S220). Concretely, as the setting of the RF function control, a condition which is not executed in conditions of the detailed test is prepared. Subsequent to the step S220, the semiconductor device 100A determines whether the detailed test is finished or not under all of conditions by the CPU 5 (step S221). When the detailed test is not finished under all of the conditions (NO in step S221), the semiconductor device 100A returns to the step S209 and continues the detailed test. On the other hand, when the detailed test is finished under all of the conditions (YES in step S221), the semiconductor device 100A performs a test result process by the CPU 5 (step S222). After the step S222, the semiconductor device 100A determines whether there is abnormality in the test result or not by the CPU 5 (step S223). When there is abnormality in the test result, the semiconductor device 100A executes a test error process according to the abnormality (step S218).

After the step S216, as a setting of the loop-back ON/OFF control, the semiconductor device 100A prepares a setting for the normal operation mode in the CPU 5 (step S224). That is, the semiconductor device 100A prepares a setting for the loop-back OFF control indicating OFF of the loop back by the CPU 5. In the case of NO in the step S219, and also in the case of NO in the step S223, the semiconductor device 100A advances to the step S224.

As a setting of the RF function control, the semiconductor device 100A prepares a setting for the normal operation in the CPU 5 (step S225). The setting for the normal operation of the RF function control to the frequency modulation control circuit 19 (the oscillation circuit 20), the frequency modulation control circuit 21 (the oscillation circuit 22), and the transmission circuits 23a and 23b is a setting for performing the normal transmission/reception by using the transmission antennas 200a and 200b and the reception antennas 300a to 300c. The setting for the normal operation of the RF function control for the clock switching circuit 26 is the setting of designating selection of the first clock signal.

By executing the loop-back OFF control by the CPU 5, the semiconductor device 100A sets the switches 14 and 15 of each of the transmission/reception loop-back switching units 13a to 13c to coupling for the normal operation mode (step S226).

When the CPU 5 executes the RF function control, the semiconductor device 100A sets the components of the RF circuit 1A (step S227). The components of the RF circuit 1A are the frequency modulation control circuit 19 (the oscillation circuit 20), the frequency modulation control circuit 21 (the oscillation circuit 22), the transmission circuits 23a and 23b, and the clock switching circuit 26.

The semiconductor device 100A generates the first beat signal by the reception circuits 24a to 24c and the mixers 25a to 25c (step S228).

The semiconductor device 100A analog-to-digital-converts the first beat signal by executing the conversion start control by the CPU 5 (step S229). A signal obtained by digital-converting the first beat signal is a first conversion data signal.

When the CPU 5 receives the conversion end signal and the first conversion data signal, the semiconductor device 100A fetches the first conversion data signal into the memory 6 (step S230).

The semiconductor device 100A analyzes the first conversion data signal by the CPU 5 (step S231) and checks whether the beat frequency of the first conversion data signal lies within the normal range or not (step S232).

When the beat frequency of the first conversion data signal lies out of the normal range (NO in step S232), the semiconductor device 100A sets the normal operation abnormality flag prepared in a register in the CPU 5 to ON by the CPU 5 (step S236), returns to the step S205, and starts a standard test. The standard test started after the normal operation abnormality flag is set to ON in the step S236 is also called a test at the time of abnormality.

On the other hand, when the beat frequency of the first conversion data signal lies within the normal range (YES in step S232), the semiconductor device 100A extracts position information and the like from an analysis result by the CPU 5 (step S233) and checks whether the timer 8 is expired or not (step S234).

When the timer 8 is expired (YES in step S234), the semiconductor device 100A returns to the stage before the setting of the timer 8 (step S203). On the other hand, when the timer 8 is not expired (NO in step S234), whether there is a sequence stop interruption such as power supply stop to the CPU 5 or not is checked (step S235).

When there is no sequence stop interruption (NO in step S235), the CPU 5 returns to the process of executing the conversion start control to the A/D converter 3 (step S229) and repeats the step S229 and subsequent steps. On the other hand, when there is a sequence stop interruption (YES in step S235), the process is finished.

As described above, in the semiconductor device 100A according to the first embodiment, the transmission unit 11A has the transmission circuits 23a and 23b used when the transmission/reception loop-back switching units 13a to 13c are in the first coupling state and the second coupling state and the transmission circuit 23c for test which is used when the transmission/reception loop-back switching units 13a to 13c are only in the second coupling state. In the semiconductor device 100A, the reception unit 12A has the reception circuits 24a to 24c and the mixers 25a to 25c used when the transmission/reception loop-back switching units 13a to 13c are in the first coupling state and the second coupling state. Further, the number obtained by adding the number of the transmission circuits 23a and 23b and the number of the transmission circuit 23c for test is equal to the number of the reception circuits 24a to 24c and the number of mixers 25a to 25c. With the configuration, the number of transmission circuits and the number of reception circuits and mixers can be matched in the test mode, and a one-to-one test by the loop-back of the transmission/reception circuits can be executed.

In the semiconductor device 100A, the RF circuit 1A has the clock generation unit 16 having the first clock generation circuit 17 generating the first clock signal and the second clock generation circuit 18 generating the second clock signal. In the semiconductor device 100A, the reception unit 12A has the clock switching circuit 26 selecting either the first clock signal or the second clock signal and supplying the selected signal to the mixers 25a to 25c. Further, the microcontroller 2A makes the clock switching circuit 26 select the first clock signal when the transmission/reception loop-back switching units 13a to 13c are in the first coupling state and makes the clock switching circuit 26 select the second clock signal when the transmission/reception loop-back switching units 13a to 13c are in the second coupling state. By the operation, the frequency set value of a beat signal generated by the reception unit 12A in the test mode and that of a beat signal generated by the reception unit 12A in the normal operation mode can be set to the same value. By preparing a plurality of frequency set values of the second clock signal and executing tests, a detailed test under a plurality of conditions can be performed.

In the semiconductor device 100A, when abnormality is found in a test, a test error process is executed. Consequently, in the semiconductor device 100A, abnormality is automatically detected and a test error process according to the abnormality can be performed, so that function safety can be realized. In the semiconductor device 100A, the microcontroller 2A has the timer 8 in which counting time that counts a time interval for a regular test of the RF circuit 1A is set. In the semiconductor device 100A, when the timer indicates time of executing a regular test, the microcontroller 2A switches the transmission/reception loop-back switching units 13a to 13c from the first coupling state to the second coupling state. With the configuration, not only in the case where the beat frequency lies out of the normal range in the normal operation mode, a standard test of the RF circuit 1A can be regularly performed.

Second Embodiment

Figure 18:
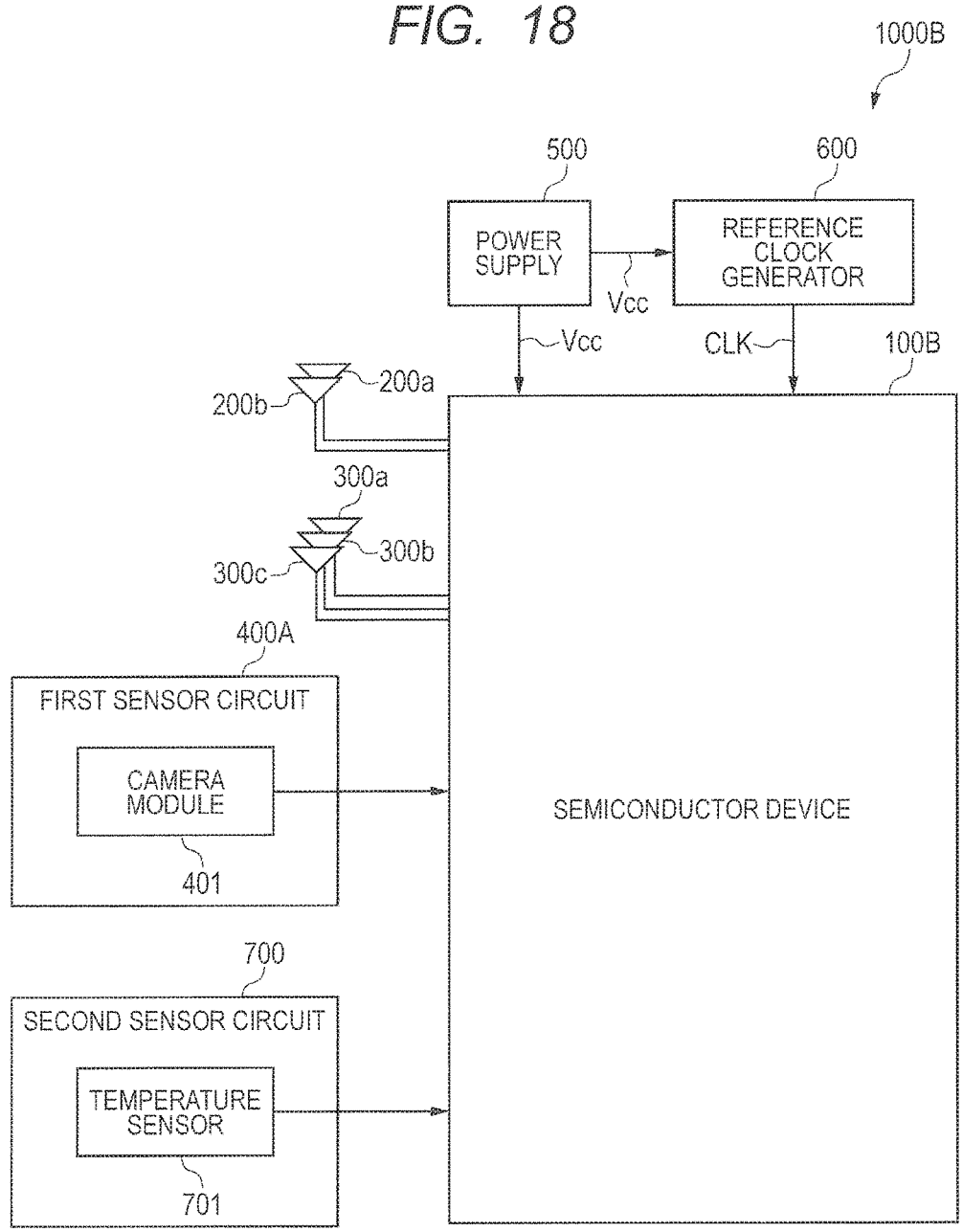
FIG. 18 is a block diagram illustrating a configuration example of a semiconductor system according to a second embodiment.

Subsequently, a second embodiment will be described. FIG. 18 is a block diagram illustrating a configuration example of a semiconductor system 1000B according to the second embodiment. The semiconductor system 1000B has a semiconductor device 100B, the transmission antennas 200a and 200b, the reception antennas 300a to 300c, the first sensor circuit 400A, the power supply 500, the reference clock generator 600, and a second sensor circuit 700. That is, the semiconductor system 1000B has, as sensor circuits, the first sensor circuit 400A and, in addition, the second sensor circuit 700.

The second sensor circuit 700 is a sensor circuit for monitoring external factors such as temperature and power supply fluctuation. The second sensor circuit 700 has a temperature sensor 701. Although FIG. 18 illustrates an example that the second sensor circuit 700 has the temperature sensor 701, the invention is not limited to the example. For example, the second sensor circuit 700 may have a power supply monitor or may have both a temperature sensor and a power supply monitor.

The temperature sensor 701 is a sensor monitoring the temperature of the semiconductor device 100B. The temperature sensor 701 outputs an analog signal of a temperature monitoring result to the semiconductor device 100B.

Figure 19:
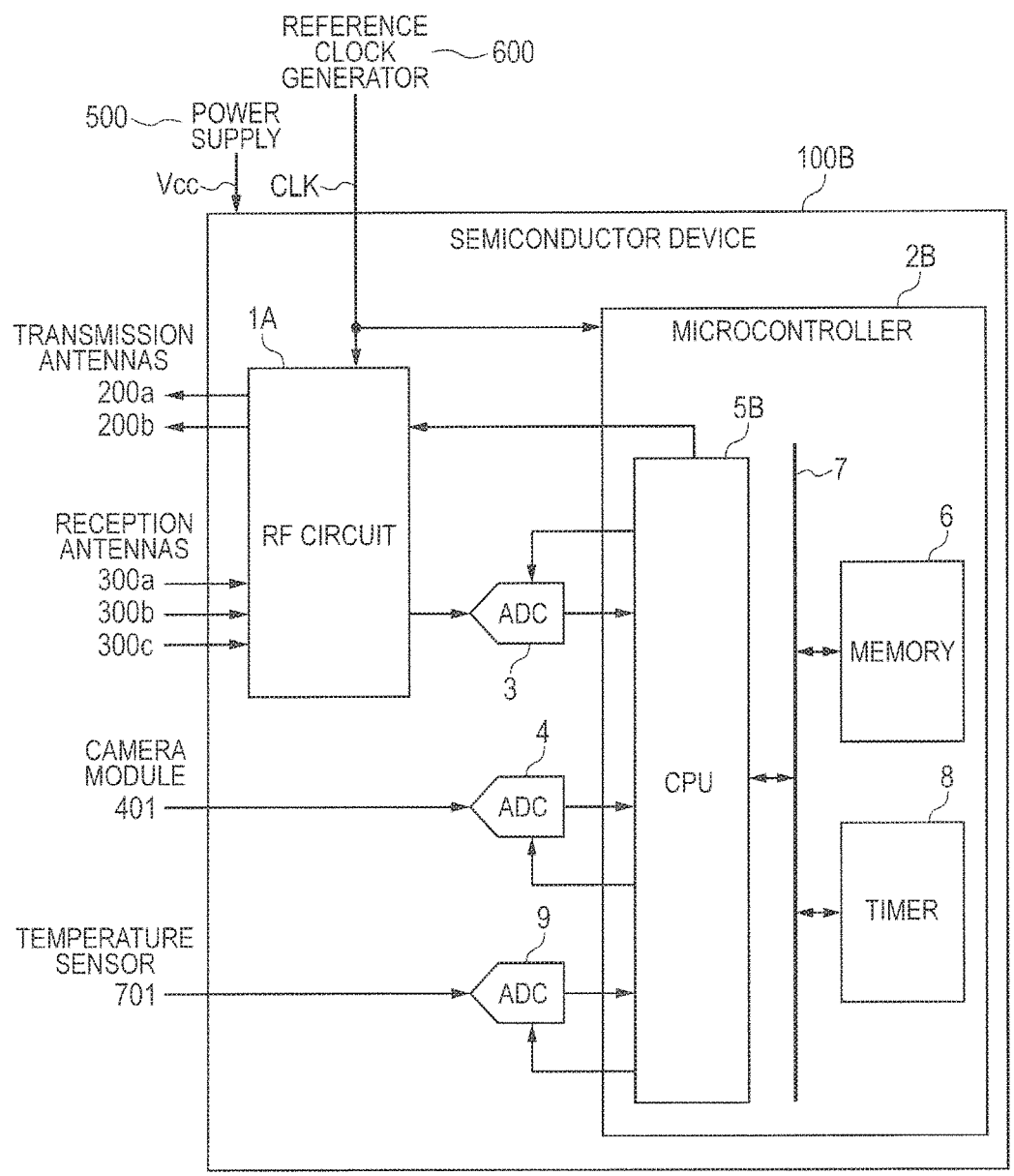
FIG. 19 is a block diagram illustrating a configuration example of a semiconductor device according to the second embodiment.

Referring to the block diagram of FIG. 19, a configuration example of the semiconductor device 100B according to the second embodiment will be described. The semiconductor device 100B has the RF circuit 1A, a microcontroller 2B, the A/D converters 3 and 4, and an A/D converter 9. The microcontroller 2A has a CPU 5B, the memory 6, and the timer 8. The CPU 5B, the memory 6, and the timer 8 are coupled via the bus 7.

The A/D converter 9 receives an analog signal of a temperature monitoring result from the temperature sensor 701. To the A/D converter 9, a conversion clock signal is supplied by control from the CPU 5B. The A/D converter 9 is subject to conversion start control from the CPU 5B and converts the analog signal of the temperature monitoring result to a digital signal to generate a third conversion data signal. The A/D converter 9 outputs the third conversion data signal and the conversion end signal to the CPU 5B.

The CPU 5B performs, in addition to storage of the first and second conversion data signals to the memory 6 and analysis, storage of the third conversion data signal to the memory and analysis. Specifically, the CPU 5B receives the third conversion data signal and the conversion end signal from the A/D converter 9 and stores the third conversion data signal into the memory 6. The CPU 5B reads the first to third conversion data signals stored in the memory 6 and analyzes the data.

Concretely, the CPU 5B analyzes the third conversion data signal in the test mode and, by checking the analysis result, determines whether the temperature is within the normal range or not. When a target object is detected, the temperature is within the normal range, and the abnormality flag is ON, the CPU 5B executes a detailed test.

Figure 20:
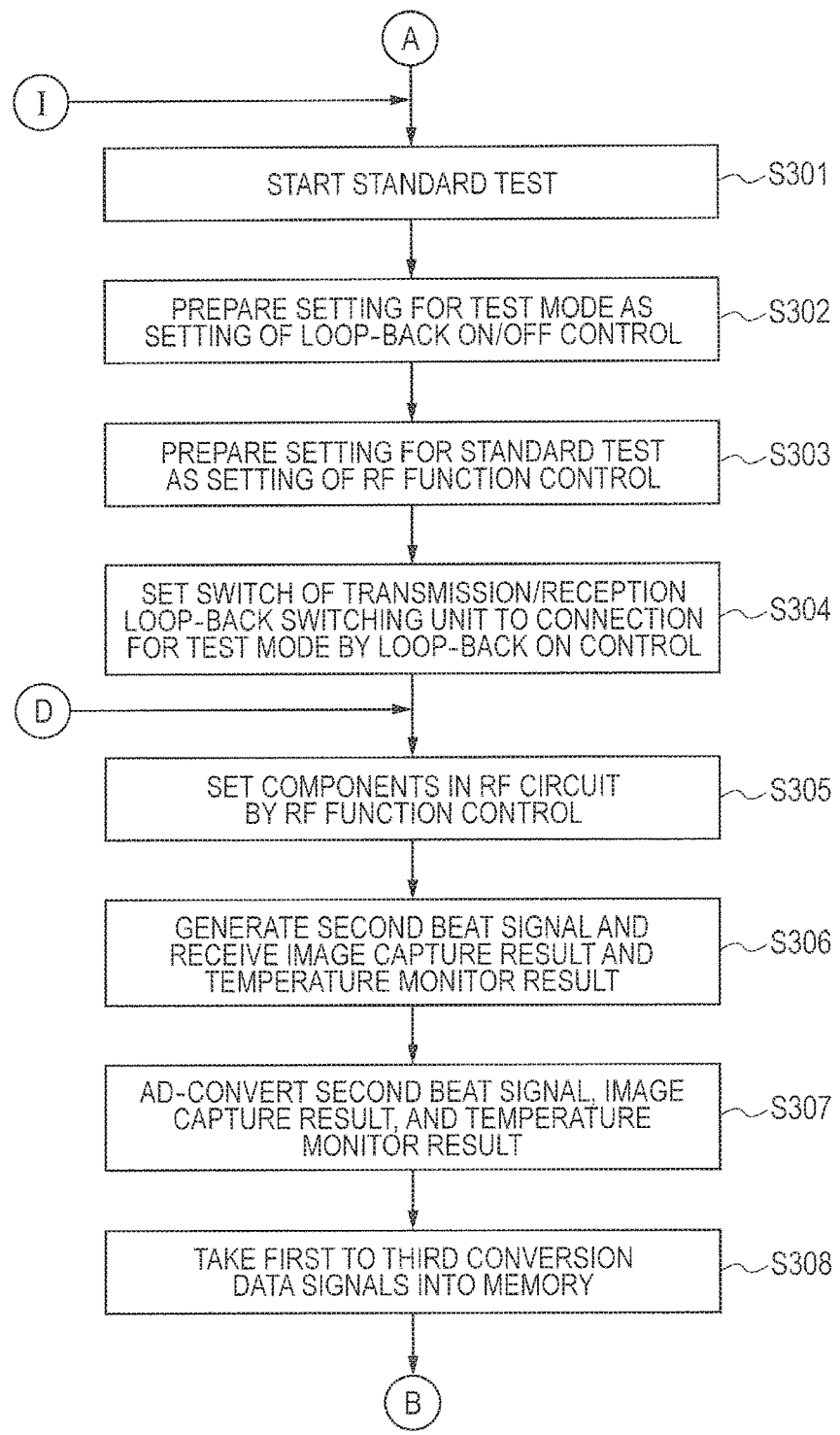
FIG. 20 is a flowchart illustrating an operation example of a test mode of the semiconductor device according to the second embodiment.
Figure 21:
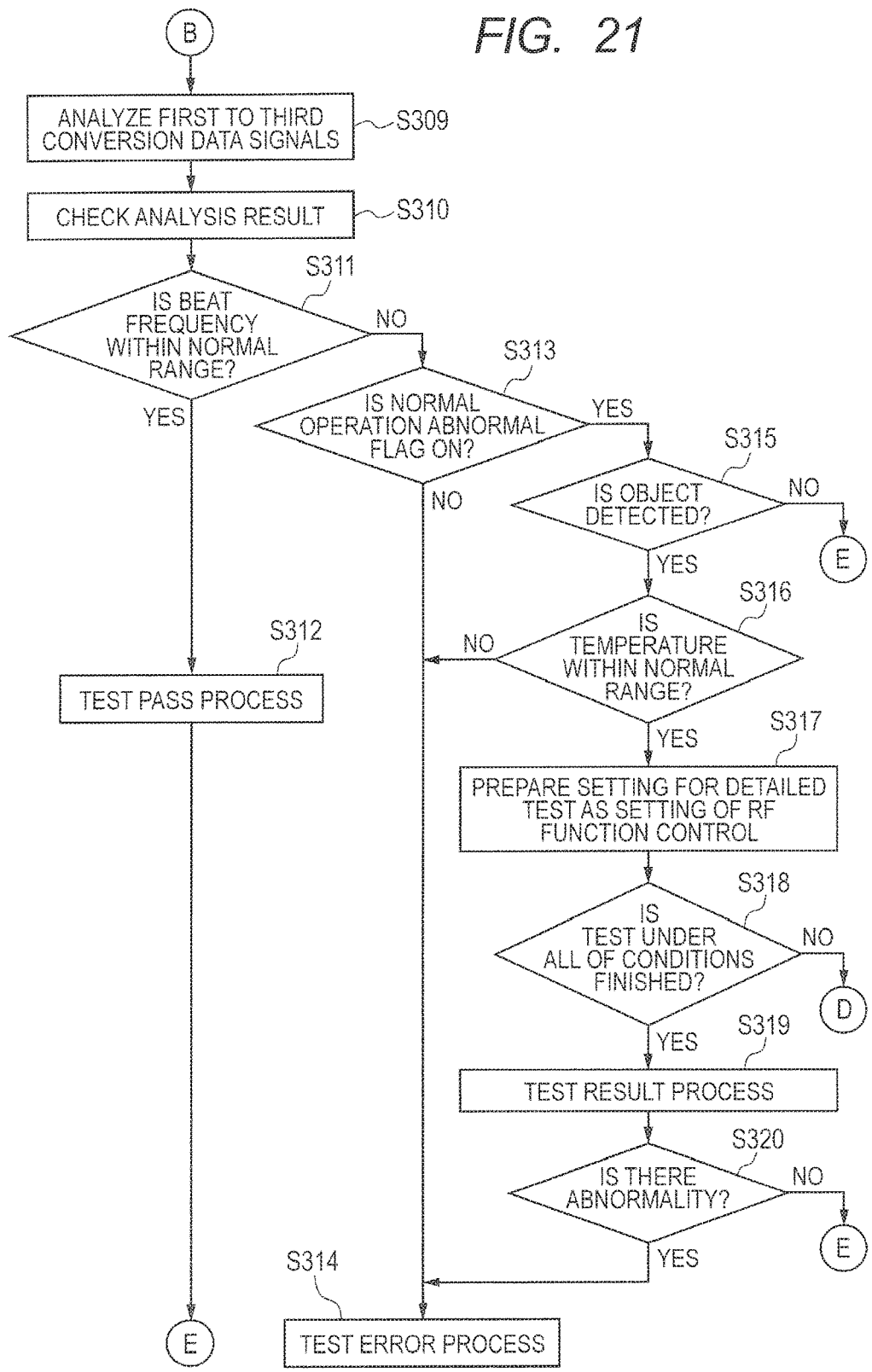
FIG. 21 is a flowchart illustrating an operation example of a test mode of the semiconductor device according to the second embodiment.

Referring to the flowcharts of FIGS. 20 and 21, an operation example in the test mode of the semiconductor device 100B according to the second embodiment will be described. The operation example at the time except for the test mode is similar to those in FIGS. 13, 16, and 17 and the description will not be repeated.

Since steps S301 to S305 are similar to the steps S205 to S209 in FIG. 14, the description will not be repeated. The semiconductor device 100B generates a second beat signal by the reception circuits 24a to 24c and the mixers 25a to 25c, receives an imaging result from the camera module 401 by the CPU 5B, and receives a temperature monitoring result from the temperature sensor 701 (step S306).

Next, when the CPU 5B executes the conversion start control, the semiconductor device 100B analog-to-digital-converts each of the second beat signal, the imaging result, and the temperature monitoring result (step S307). The signal obtained by converting the second beat signal to a digital signal is the first conversion data signal, the signal obtained by converting the imaging result to a digital signal is the second conversion data signal, and a signal obtained by converting the temperature monitoring result to a digital signal is the third conversion data signal.

The semiconductor device 100B receives the conversion end signal and the first to the third conversion data signals by the CPU 5B and stores the first to third conversion data signals into the memory 6 (step S308).

Subsequently, the semiconductor device 100B analyzes the first to third conversion data signals by the CPU 5B (step S309) and checks each of analysis results (step S310).

The semiconductor device 100B determines whether the beat frequency of the first conversion data signal is within the normal range or not by the CPU 5B (step S311).

When the beat frequency of the first conversion data signal is within the normal range (YES in step S311), the semiconductor device 100B performs the test pass process by the CPU 5B (step S312). On the other hand, when the beat frequency of the first conversion data signal is out of the normal range (NO in step S311), the semiconductor device 100B determines whether the normal operation abnormal flag is ON or not by the CPU 5B (step S313).

When the normal operation abnormality flag is OFF (NO in step S313), the semiconductor device 100B performs a test error process (step S314). On the other hand, when the normal operation abnormality flag is ON (YES in step S313), the semiconductor device 100B determines whether the second conversion data signal indicates detection of a target object or not by the CPU 5B (step S315).

When the second conversion data signal indicates detection of a target object (YES in step S315), the semiconductor device 100B determines whether the third conversion data signal indicates temperature within the normal range or not by the CPU 5B (step S316).

When the third conversion data signal indicates temperature out of the normal range (NO in step S316), the semiconductor device 100B performs a test error process (step S314). On the other hand, when the third conversion data signal indicates temperature within the normal range (YES in step S316), the semiconductor device 100B prepares setting for a detailed test as the setting of the RF function control in the CPU 5B (step S317). Concretely, as the setting of the RF function control, a condition which is not executed in the conditions of the detailed test is prepared. Next, the semiconductor device 100B determines whether the detailed test is completed under all of conditions or not by the CPU 5B (step S318). When the detailed test under all of the conditions is not completed (NO in step S318), the semiconductor device 100B returns to the step S305 and continues the detailed test. On the other hand, when the detailed test is completed under all of the conditions (YES in step S318), the semiconductor device 100B performs a test result process by the CPU 5B (step S319). Subsequent to the step S319, the semiconductor device 100B determines whether there is abnormality in the test result or not by the CPU 5B (step S320). When there is abnormality in the test result, the semiconductor device 100B performs a test error process according to the abnormality (step S314).

After the step S312, the semiconductor device 100B advances to step S224. In the case of NO in the step S315 and NO in the step S320, the semiconductor device 100B advances to step S224.

As described above, in the semiconductor device 100B according to the second embodiment, the microcontroller 2B uses also an output signal of the second sensor circuit 700 for monitoring external factors such as temperature and power supply fluctuation as conditions for determining whether the detailed test of the RF circuit 1A is executed or not. With the configuration, in the semiconductor device 100B, whether the detailed test of the RF circuit 1A is necessary or not can be determined in consideration of abnormality due to temperature or power supply fluctuation. In the semiconductor device 100B, when abnormality due to temperature or power supply fluctuation is detected, the test error process according to the abnormality can be performed. Consequently, in the semiconductor device 100B, the cause of abnormality can be captured from various directions, and the function safety can be further enhanced.

The example of configuring the three pairs of transmission and reception circuits by the transmission circuits 23a and 23b, the transmission circuit 23c for test, and the reception circuits 24a to 24c has been described above. Although the example of setting the three pairs of the transmission and reception circuits in a lump in the normal operation mode or the test mode has been described above, the invention is not limited to the example. The three pairs of the transmission and reception circuits may be individually set like in the normal operation mode, the test mode, and the test mode, respectively or in the normal operation mode, the normal operation mode, and the test mode, respectively. In this case, the clock switching circuit 26 individually selects either the first clock signal or the second clock signal for each of the three pairs of the transmission and reception circuits. In such a configuration, for example, when abnormality occurs in a pair of the transmission circuit 23a and the reception circuit 24a, a use way of stopping the operation of the pair of the transmission circuit 23a and the reception circuit 24a and continuing a pair of the transmission circuit 23b and the reception circuit 24b can be realized.

Although the present invention achieved by the inventors herein has been described concretely above, obviously, the present invention is not limited to the foregoing embodiments but can be variously changed without departing from the gist.

What is claimed is:

1. A semiconductor device comprising an RF circuit and a microcontroller,
wherein the RF circuit comprises:
a transmission unit generating a transmission signal;
a reception unit generating a first generation signal and a second generation signal; and
a transmission/reception loop-back switching unit switching between a first coupling state of coupling an output terminal of the transmission unit to a transmission antenna and coupling an input terminal of the reception unit to a reception antenna and a second coupling state of coupling an output terminal of the transmission unit to the input terminal of the reception unit,
wherein the reception antenna is an antenna receiving, as a reception signal, a reflection wave which is a transmission signal transmitted from the transmission antenna and reflected by a target object when the transmission/reception loop-back switching unit is in the first coupling state, and
wherein the microcontroller switches the transmission/reception loop-back switching unit to the second coupling state in the case where the first generation signal when the transmission/reception loop-back switching unit is in the first coupling state is not normal, and
executes a test of the RF circuit on the basis of the second generation signal when the transmission/reception loop-back switching unit is in the second coupling state and an output signal of a first sensor circuit detecting the target object.

2. The semiconductor device according to claim 1, wherein the microcontroller executes a detailed test of the RF circuit in the case where frequency of the second generation signal is out of a normal range and an output signal of the first sensor circuit indicates detection of the target object when the transmission/reception loop-back switching unit is in the second coupling state.

3. The semiconductor device according to claim 2, wherein when abnormality of the RF circuit is detected by the detailed test, the microcontroller executes an error process.

4. The semiconductor device according to claim 2, wherein the transmission unit comprises:
a transmission circuit used in the first coupling state and the second coupling state; and
a transmission circuit for test which is used only in the second coupling state,
wherein the reception unit comprises a reception circuit and a mixer used in the first coupling state and the second coupling state, and
wherein the number obtained by adding the number of transmission circuits and the number of the transmission circuit for test is equal to the number of reception circuits and the number of mixers.

5. The semiconductor device according to claim 4, wherein the RF circuit further comprises a clock generating unit,
wherein the clock generating unit comprises:
a first clock generation circuit generating a first clock signal; and
a second clock generation circuit generating a second clock signal,
wherein the reception unit further comprises a clock switching circuit selecting either the first clock signal or the second clock signal and supplying the selected signal to the mixer, and
wherein the microcontroller controls to make the clock switching circuit select the first clock signal in the first coupling state and make the clock switching circuit select the second clock signal in the second coupling state.

6. The semiconductor device according to claim 2, wherein the microcontroller comprises a timer in which counting time that counts a time interval for a regular test of the RF circuit is set, and
wherein when the timer indicates time to execute the regular test, the microcontroller switches the transmission/reception loop-back switching unit from the first coupling state to the second coupling state.

7. The semiconductor device according to claim 2, wherein the microcontroller executes a detailed test of the RF circuit in the case where the frequency of the second generation signal is out of a normal range when the transmission/reception loop-back switching unit is in the second coupling state, an output signal of the first sensor circuit indicates detection of the target object, and the value of an output signal of a second sensor circuit for monitoring an external factor is within a normal range.

8. The semiconductor device according to claim 1, wherein the first generation signal is a first beat signal generated from the reception signal and a first clock signal, and the second generation signal is a second beat signal generated from the transmission signal and a second clock signal.

9. A semiconductor system comprising:
a semiconductor device;
a transmission antenna;
a reception antenna; and
a first sensor circuit detecting a target object,
wherein the semiconductor device comprises an RF circuit and a microcontroller,
wherein the RF circuit comprises:
a transmission unit generating a transmission signal;
a reception unit generating a first generation signal and a second generation signal; and
a transmission/reception loop-back switching unit switching between a first coupling state of coupling an output terminal of the transmission unit to the transmission antenna and coupling an input terminal of the reception unit to the reception antenna and a second coupling state of coupling an output terminal of the transmission unit to the input terminal of the reception unit,
wherein the reception antenna is an antenna receiving, as a reception signal, a reflection wave which is a transmission signal transmitted from the transmission antenna and reflected by the target object when the transmission/reception loop-back switching unit is in the first coupling state, and
wherein the microcontroller switches the transmission/reception loop-back switching unit to the second coupling state in the case where the first generation signal when the transmission/reception loop-back switching unit is in the first coupling state is not normal, and
executes a test of the RF circuit on the basis of the second generation signal when the transmission/reception loop-back switching unit is in the second coupling state and an output signal of the first sensor circuit.

10. The semiconductor system according to claim 9, wherein the microcontroller executes a detailed test of the RF circuit in the case where frequency of the second generation signal is out of a normal range and an output signal of the first sensor circuit indicates detection of the target object when the transmission/reception loop-back switching unit is in the second coupling state.

11. The semiconductor system according to claim 10, wherein when abnormality of the RF circuit is detected by the detailed test, the microcontroller executes an error process.

12. The semiconductor system according to claim 10, wherein the transmission unit comprises:
a transmission circuit used in the first coupling state and the second coupling state; and
a transmission circuit for test which is used only in the second coupling state,
wherein the reception unit comprises a reception circuit and a mixer used in the first coupling state and the second coupling state, and
wherein the number obtained by adding the number of transmission circuits and the number of the transmission circuit for test is equal to the number of reception circuits and the number of mixers.

13. The semiconductor system according to claim 12, wherein the RF circuit further comprises a clock generating unit,
wherein the clock generating unit comprises:
a first clock generation circuit generating a first clock signal; and
a second clock generation circuit generating a second clock signal,
wherein the reception unit further comprises a clock switching circuit selecting either the first clock signal or the second clock signal and supplying the selected signal to the mixer, and
wherein the microcontroller controls to make the clock switching circuit select the first clock signal in the first coupling state and make the clock switching circuit select the second clock signal in the second coupling state.

14. The semiconductor system according to claim 10,
wherein the microcontroller comprises a timer in which counting time that counts a time interval for a regular test of the RF circuit is set, and
wherein when the timer indicates time to execute the regular test, the microcontroller switches the transmission/reception loop-back switching unit from the first coupling state to the second coupling state.

15. The semiconductor system according to claim 10, further comprising a second sensor circuit for monitoring an external factor,
wherein the microcontroller executes a detailed test of the RF circuit in the case where the frequency of the second generation signal is out of a normal range when the transmission/reception loop-back switching unit is in the second coupling state, an output signal of the first sensor circuit indicates detection of the target object, and the value of an output signal of the second sensor circuit is within a normal range.

16. The semiconductor system according to claim 9, wherein the first generation signal is a first beat signal generated from the reception signal and a first clock signal, and the second generation signal is a second beat signal generated from the transmission signal and a second clock signal.

* * * * *